US007003375B2

(12) United States Patent
Inui

(10) Patent No.: US 7,003,375 B2
(45) Date of Patent: Feb. 21, 2006

(54) LOAD STORAGE APPARATUS

(75) Inventor: Yoshitaka Inui, Shiga (JP)

(73) Assignee: Daifuku Co., Ltd., Osaka (JP)

( * ) Notice: Subject to any disclaimer, the term of this patent is extended or adjusted under 35 U.S.C. 154(b) by 407 days.

(21) Appl. No.: 10/234,228

(22) Filed: Sep. 3, 2002

(65) Prior Publication Data
US 2003/0046023 A1 Mar. 6, 2003

(30) Foreign Application Priority Data
Aug. 31, 2001 (JP) ............................. 2001-262582

(51) Int. Cl.
G06F 7/00 (2006.01)
(52) U.S. Cl. ...................... 700/218; 700/47; 700/264; 414/331.02; 414/331.05; 414/940
(58) Field of Classification Search ................ 700/213, 700/214, 218, 47, 250, 259, 264; 414/935, 414/940, 217, 331.02, 331.05
See application file for complete search history.

(56) References Cited

U.S. PATENT DOCUMENTS

| 6,357,984 | B1 * | 3/2002 | Zinger et al. ........... 414/331.05 |
| 6,464,789 | B1 * | 10/2002 | Akimoto ..................... 118/666 |
| 6,582,174 | B1 * | 6/2003 | Hayashi ..................... 414/217 |
| 6,582,182 | B1 * | 6/2003 | Whalen ...................... 414/276 |
| 6,591,160 | B1 * | 7/2003 | Hine et al. ................. 700/218 |
| 6,722,837 | B1 * | 4/2004 | Inui ........................ 414/331.05 |
| 6,856,863 | B1 * | 2/2005 | Sundar ....................... 700/254 |

FOREIGN PATENT DOCUMENTS

| JP | 04-292312 | 10/1992 |
| JP | 08-127405 | 5/1996 |
| JP | 10-098095 | 4/1998 |
| JP | 10-279023 | 10/1998 |

* cited by examiner

Primary Examiner—Khoi H. Tran
(74) Attorney, Agent, or Firm—Goodwin Procter, LLP

(57) ABSTRACT

The object of the present invention is to provide a load storage apparatus that can automatically and efficiently adjust the distances for which its transferrer moves loads to transfer them. The apparatus may include a rotary rack, fixed racks and a transferrer. Each of the racks may include shelves. The transferrer includes a carrier for transferring cassettes by moving relative to the shelves. The carrier can be fitted with a unit including a photoelectric switch for detecting ends of the shelves. The apparatus measures the distance for which the carrier moves from a reference position toward each of the shelves until the photoelectric switch of the unit on the carrier is activated. The measurement enables the apparatus to learn the distance for which the carrier moves to the position where a cassette can be transferred onto and from each of the shelves. Consequently, it is possible to transfer the cassettes without hindrance even if the cassette-positioning pins of the shelves shift slightly out of position. Additionally, prior to operation of the apparatus, an operator does not need to adjust the distances for which the carrier moves.

16 Claims, 14 Drawing Sheets

LOAD STORAGE APPARATUS

BACKGROUND OF THE INVENTION

1. Field of the Invention

The present invention relates to load storage apparatus or equipment for storing loads in a clean room or the like.

2. Brief Description of the Prior Art

A conventional load storage apparatus includes a rack with shelves or other load supports, each of which can support a cassette containing a number of wafers or liquid crystal panels. The shelves have pins for positioning the cassettes supported on the shelves. The cassettes have holes for engaging with the pins. The engagement prevents the cassettes on the shelves from shifting out of position in such a manner that the cassettes cannot be taken normally out of the storage apparatus. The engagement also prevents the cassettes on the shelves from falling due to the vibration of the shelves during the operation of the storage apparatus, or due to an earthquake, for example.

The storage apparatus also includes a transferrer for loading and unloading the rack. The transferrer includes a carrier, which is designed to move for constant distances in order to transfer the cassettes to and from the shelves.

The rack may be three-dimensional, with the shelves large in number. In this case, initial errors in size of the rack, installation or fixation errors in horizontal and/or vertical accuracy of the rack, and/or other errors may delicately or slightly vary the positions of the positioning pins of the shelves relative to the carrier of the transferrer and/or the distance between each of the pins and the carrier. The variation may prevent the cassette holes from engaging normally with the shelf pins so that the cassettes can be normally loaded and unloaded. Therefore, before the rack is loaded with cassettes or unloaded, an operator must make adjustments by causing the transferrer to operate for each of the shelves, measuring the proper distance for which the carrier moves relative to each of the shelves, and recording the measured distances.

The adjustments require much time and labor, and operators different in skill may make various adjustments.

SUMMARY OF THE INVENTION

In view of the foregoing problems, it is the object of the present invention to provide a load storage apparatus that can automatically and efficiently learn a proper distance for which the carrier of the transferrer moves relative to each load support of the rack, and can safely and normally load and unload the load support on the basis of the learned value.

A load storage apparatus according to the present invention includes a rack, a transferrer and a learning system. The rack includes a plurality of load supports each having a detection part. The transferrer includes a carrier for transferring loads to and from the load supports by means of transfer that includes movement relative to the load supports. The carrier includes a detector for detecting the detection parts of the load supports. The learning system measures the distance for which the carrier moves from a reference position toward each of the load supports until the detector detects the associated detection part. On the basis of the measured distance, the learning system computes the distance for which the carrier should move from the reference position to a position where to load and unload the load support. The learning system stores the computed distance as a learned distance for the load support. Thus, the carrier can operate for the load support by being driven on the basis of the learned distance.

Before the rack is loaded or unloaded, the carrier of the transferrer may be positioned in the reference position for each of the load supports and moved toward the load support. The storage apparatus can automatically measure the distance for which the carrier has moved until the detector of the carrier detects the detection part of the load support.

The position where the detector of the carrier detects the detection part of the load support may be the transfer position where the carrier transfers loads to and from the load support. In this case, the measured value can be stored as the learned distance between the reference and transfer positions for the load support. The detector may also detect the detection part short of the transfer position by a fixed value. In this case, the fixed value is added to the measured value. The sum of the values can be stored as the learned distance for the load support.

The storage apparatus can load or unload the load support by actuating the carrier on the basis of the learned distance for this load support. This ensures the expected or intended positional relation between the load support and the carrier having moved to the transfer position. It is consequently possible to transfer a load normally and safely between the carrier and the load support.

Thus, the storage apparatus can automatically and efficiently learn the distances for which the carrier moves toward and away from the load supports. This prevents the distances from varying if they were manually adjusted. It is possible to transfer a load normally and safely between the carrier and each of the load supports by only actuating the carrier on the basis of the learned distance set for the load support.

Additionally, each of the load supports may be fitted with positioning pins. Initial errors in size of the rack, installation or fixation errors in horizontal and/or vertical accuracy of the rack, and/or other errors may delicately or slightly vary the positions of the positioning pins relative to the carrier and/or the distance between each of the pins and the carrier. Even in this case, the storage apparatus ensures safe storage of loads, with the positioning pins normally functioning.

It is preferable that the detector be fitted detachably to the carrier. If the detector is fixed to the carrier, the fixed detector needs to be positioned out of interference with the loads being loaded and unloaded. If the detector can be detached from the carrier, there is no such positional limitation. This makes it possible to fit the detector in the most suitable position for good detection of the detection parts of the load supports. Additionally, this allows more options for the positions of the detection parts.

The carrier may include a positioner for positioning a load on the carrier. The positioner can position the detector on the carrier.

The positioner can position the detector with accuracy on the carrier, thus improving the learning accuracy. Because the positioner is not exclusive for the detector, the storage apparatus is advantageous in terms of costs.

The detection part of each load support may be positioned anywhere on it, and be an exclusive detection member fitted to it. However, it is preferable that the detection part of each load support be an end thereof adjacent to the carrier.

The use of the end of the load support obviates the need for an exclusive detection member. Thus, the end can be detected accurately without being affected by other parts.

The rack may be of various types. For example, the rack may be a rotary rack that can turn on a vertical axis. The load supports of the rotary rack can be arranged circumferentially around the vertical axis. The transferrer may be positioned laterally outside the rotary rack. The rotary rack has a circumferential transfer position adjacent the transferrer. The carrier can transfer loads to and from the load support in the transfer position. The load supports of the rotary rack may be stages of load supports arranged vertically around the vertical axis. The carrier can vertically move to operate for the stages of load supports.

Alternatively, the rack may be two or more fixed racks arranged around the transferrer. The carrier can turn on a vertical axis to operate for the load supports of the fixed racks around it. The load supports of the fixed racks may be vertically arranged stages of load supports. The carrier can vertically move to operate for the stages of load supports.

As is the case with some of the embodiments described later on, the rotary and fixed racks may be provided for use with one transferrer. In this case, the storage apparatus, inclusive of the racks and the transferrer, may be isolated in a clean room from the atmosphere.

As is the case with the rotary and fixed racks, the load supports may be vertically arranged stages of load supports. The carrier can vertically move to operate for the stages of load supports. Each of the load supports may include a second detection part. The transferrer may include a second detector for detecting the second detection parts of the load supports. The learning system can measure the vertical distance for which the carrier moves vertically from a vertical reference position, which may be its lowest position, until the second detector detects the second detection part of each load support. On the basis of the measured vertical distance, the learning system can compute the vertical distance for which the carrier should move vertically from the vertical reference position to a vertical position for load transfer to and from the load support. The learning system can store the computed vertical distance as a learned vertical distance for the load support. The carrier can operate for the load support by being moved vertically on the basis of the learned vertical distance.

Thus, the carrier can be moved vertically on the basis of the learned vertical distance stored for each of the load supports. Accordingly, even if the stages of load supports are spaced unevenly, the carrier can be positioned reliably at the adequate transfer level for the load support to be loaded or unloaded. This makes it possible to transfer a load normally and safely to or from the load support.

As is the case with the fixed racks, the load supports may be arranged circumferentially around the transferrer. The carrier can turn on a vertical axis to operate for the circumferentially arranged load supports. Each of the circumferentially arranged load supports includes a third detection part. The transferrer may include a third detector for detecting the third detection parts of the load supports. The learning system can measure the angle for which the carrier turns from an angular reference position until the third detector detects the third detection part of each load support. The learning system stores the measured angle as a learned angle for the load support. The carrier can operate for the load support by being turned on the basis of the learned angle.

Thus, the carrier can be turned on the basis of the learned angle stored for each of the circumferentially arranged load supports. Accordingly, even if the load supports are spaced angularly at uneven intervals, the carrier can be positioned reliably at the angularly adequate transfer position for the load support to be loaded or unloaded. This makes it possible to transfer a load normally and safely to or from the load support.

If the load supports are arranged both around the transferrer and vertically, as is the case with the fixed racks, or if the rotary rack is provided in addition, as is the case with some of the embodiments, each of the load supports may have the three detection parts, and the transferrer may be fitted with the three detectors. Practically, the three detection parts may be replaced by one or two detection parts, and the three detectors may be replaced by one or two detectors.

The second or third detection part of each load support may be formed on an end face thereof adjacent to the carrier. Each of the second and third detection parts may be formed according to the detection system of the detector. Therefore, each of these detection parts may, as the need arises, be a reflecting tape or a magnetic plate fixed to the end face of the associated load support, or may be the end face itself.

Other characteristics of the present invention will be understood easily from the preferred embodiments described below with reference to the accompanying drawings.

EXEMPLARY EMBODIMENTS

The following sections describe exemplary embodiments of the present invention. It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute terms, such as, for example, "will," "will not," "shall," "shall not," "must," and "must not," are not meant to limit the scope of the present invention as the embodiments disclosed herein are merely exemplary.

With reference to FIGS. 1–10, a first exemplary embodiment of the present invention is described below.

Figure 2:
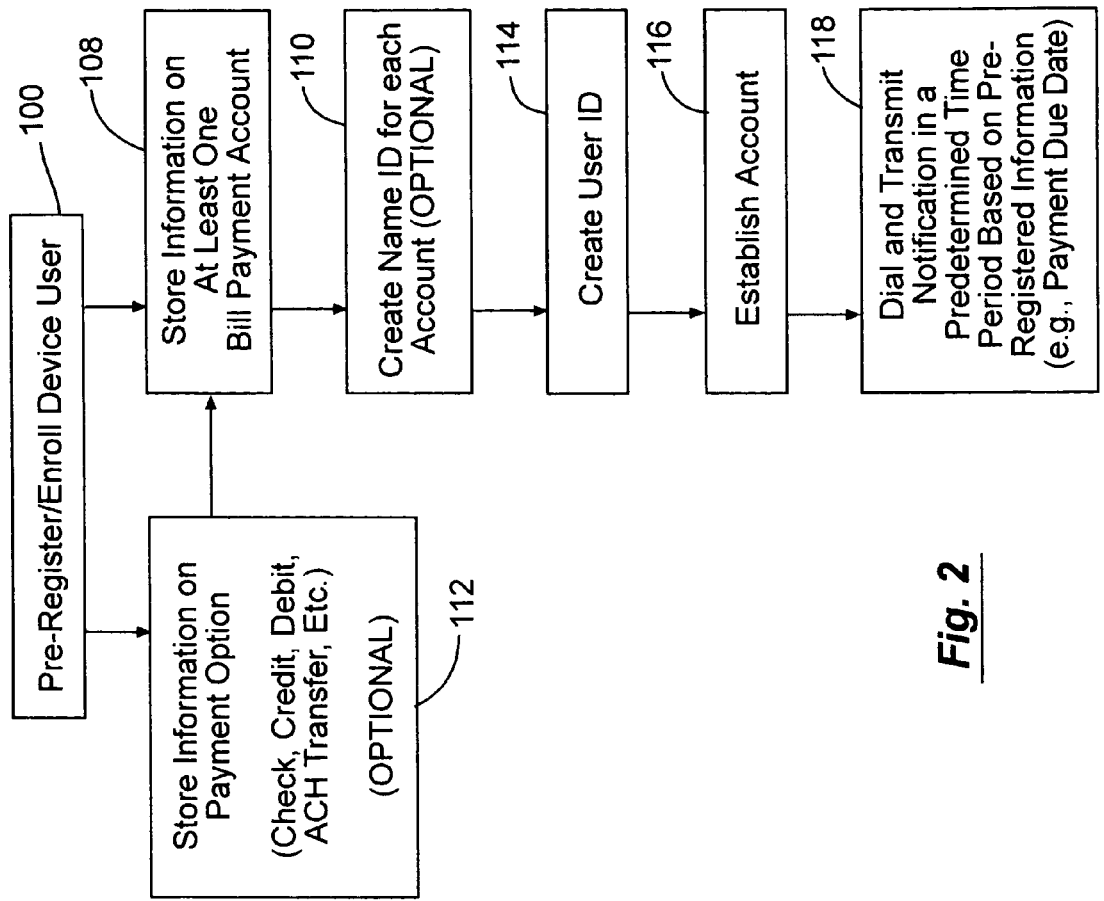
FIG. 2 is a perspective view of the storage apparatus.
Figure 1:
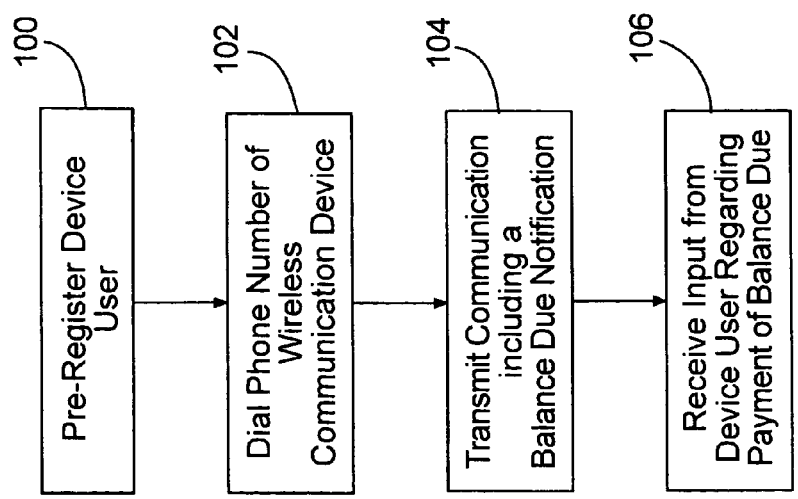
FIG. 1 is a top plan in horizontal section of a load storage apparatus according to a first embodiment of the present invention.
Figure 3A:
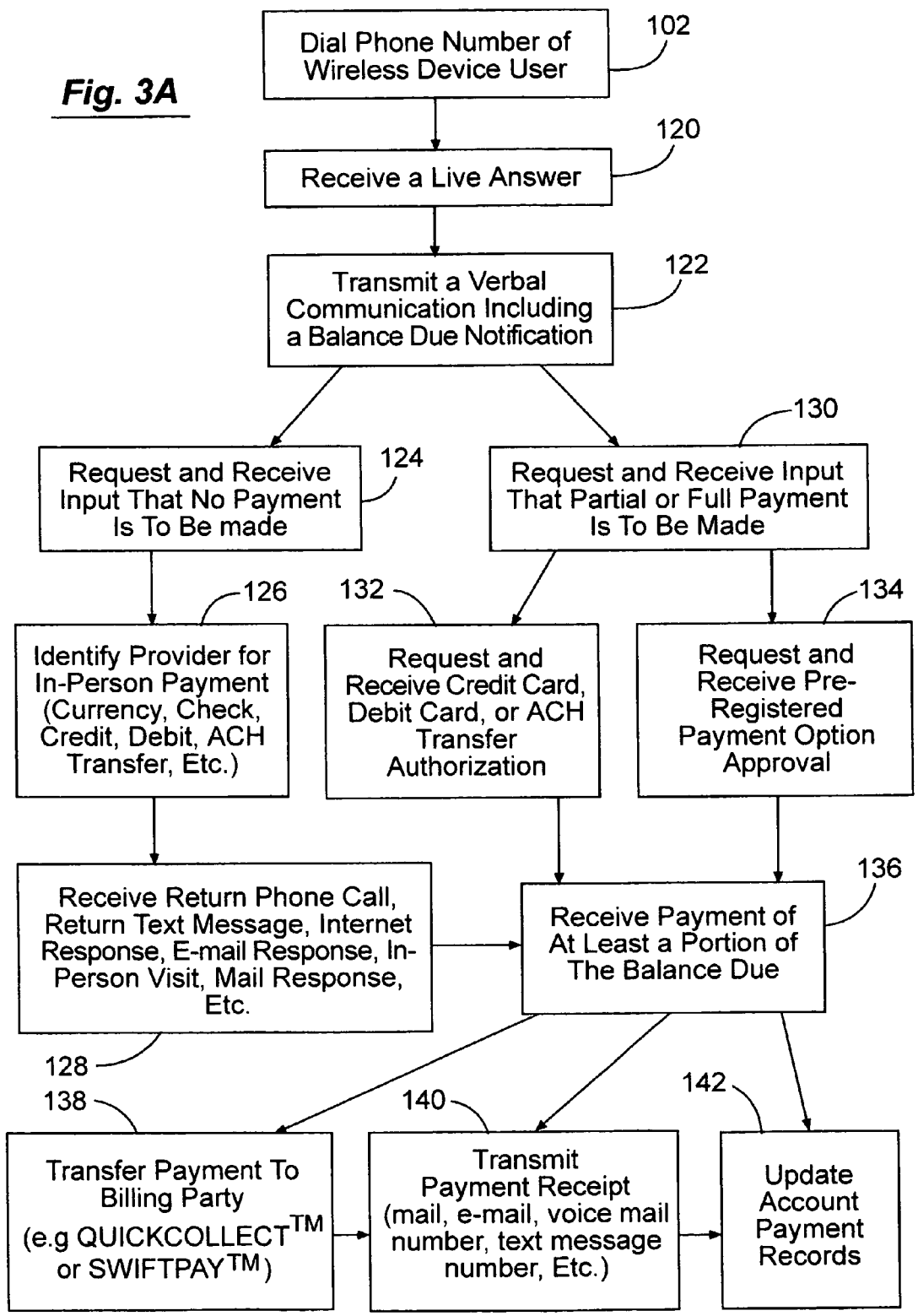
FIG. 3 is a side view in vertical section of the storage apparatus.
Figure 3B:
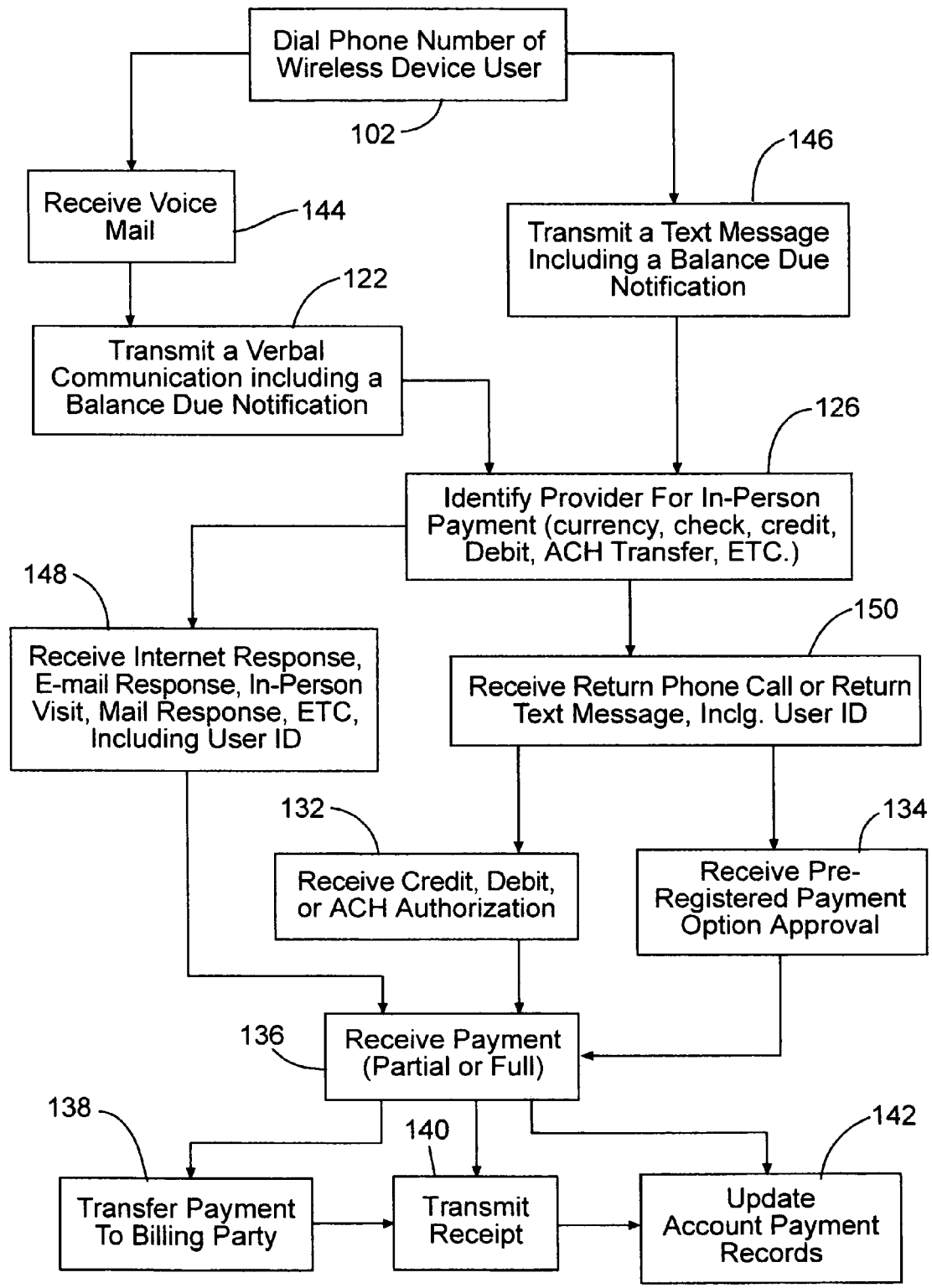
Figure 4:
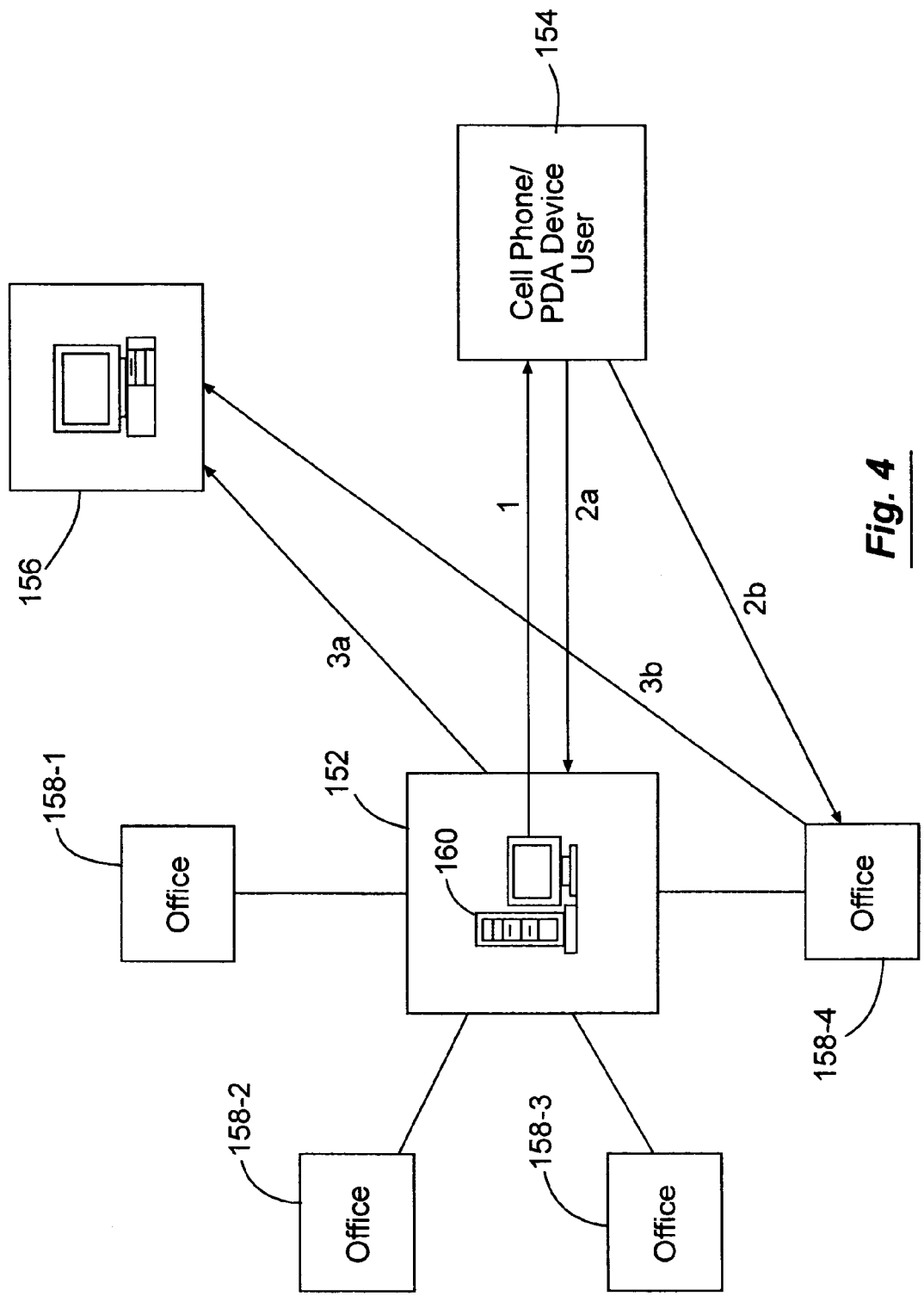
FIG. 4 is a side view partially in section of a lower portion of the rotary rack of the storage apparatus.

As shown in FIGS. 1–3, an exemplary load storage apparatus 10 is installed in a clean room 1, which has a ceiling 2 and a floor 3. The clean room 1 is constructed on a downflow system, where purified air A is supplied through the ceiling 2 into the room 1, flows downward through the room and is discharged from the room through the floor 3. The storage apparatus 10 includes a housing 11 in the form of a rectangular box, in which a rotary rack 21, a transferrer 51 and four fixed racks 101 are fitted.

The housing 11 includes a framework 12, a lower wall 13 and an upper wall 14. The walls 13 and 14 surround the lower and upper halves respectively of the framework 12. At least part of the walls 13 and 14, mainly the upper wall 14, is one or more transparent plates made of resin or the like, through which it is possible to observe the condition of the storage chamber or space 15 within the housing 11. A length of one or more of the vertical corners of the housing 11 is cut obliquely. For example, the four vertical corners 16 of the part of the housing 11 surrounded by the upper wall 14 are cut obliquely.

In this embodiment, the housing 11 is open at its top and bottom so that clean air A can flow from the ceiling 2 downward through the storage chamber 15 in the housing 11 to keep this chamber clean. The framework 12 has legs 17 standing on the floor 3.

As shown in FIGS. 1 and 3–5, in this embodiment, the rotary rack 21 is supported in the storage chamber 15 and positioned near one side of this chamber. The rotary rack 21 can turn on a vertical rack axis 22 and has a cylindrical turning path 23 coaxial with this axis. The rotary rack 21 includes a number of horizontal shelves 32 as load supports, which are arranged on the turning path 23.

A base plate 24 is supported by the legs 17 over the floor 3 and supports a turning disk 26 with a circular LM guide 25 interposed between them. The LM guide 25 and the turning disk 26 are coaxial with the rack axis 22. The turning disk 26 coaxially supports a hexagonal hollow column 27, which is closed at its top with a closing plate 27A. A vertical pin 28 stands on the center of the closing plate 27A. The housing 11 is fitted with a supporting plate 18 at its top. The vertical pin 28 is supported rotatably by the supporting plate 18 with a bearing 29 interposed between them.

The hexagonal column 27 is fitted with a number of hexagonal plates 30 at vertical intervals, each of which is fixed to it by means of circumferentially spaced fixtures 31. Each of the hexagonal plates 30 supports, for example, six or some of the shelves 32 at circumferentially regular intervals. Each of the shelves 32 is fixed at one end to the periphery of the associated hexagonal plate 30 with connectors 33 and protrudes in the form of a cantilever away from the rack axis 22.

In the present embodiment, each of the shelves 32 has a recess 34, which is open vertically and away from the hexagonal plate 30. Each shelf 32 is fitted with one or more (for example, three in the drawings) positioning pins 35, which stand on it around the associated recess 34. Each shelf 32 is also fitted with a reflecting mirror 36 as part of a load detector on its fixed end and a reflecting tape 37 as part of a level detector on its free end.

The rotary rack 21 can be turned by a rack driver 41, which includes a rotational drive 42 mounted at a corner of the base plate 24. A driving shaft 43 extends downward from the rotational drive 42 and is fitted with a driving gear 44. The turning disk 26 is fitted with a ring gear 45 around it, which is in mesh with the driving gear 44. The rotational drive 42 is a combination of an AC servo motor, a speed reducer, etc., and can turn the driving shaft 43 in opposite directions.

The turning of the driving shaft 43 in opposite directions by means of the rotational drive 42 turns the rotary rack 21 in opposite directions on the rack axis 22 through the gears 44 and 45. The rotary rack 21 can turn up to 180 degrees. The parts and/or components 24–45 compose the rotary rack 21.

As shown in FIGS. 1, 3 and 6–8, the rotary rack 21 and the transferrer 51 may be positioned side by side in the storage chamber 15. The transferrer 51 includes a carrier 81. The carrier 81 can turn on a vertical transfer axis 52 and operate on a cylindrical transfer path 53, which is coaxial with this axis 52 and in point contact with the cylindrical turning path 23.

The reflecting mirror 36 and tape 37 of each shelf 32 of the rotary rack 21 may be fixed in such a manner that their specular surfaces are oriented toward the transfer axis 52 when the shelf 32 is positioned in front of the carrier 81 of the transferrer 51.

The transferrer 51 includes a base frame 54, which can be fitted over the floor 3. A post 55 stands on the base frame 54 and can be fitted with a pair of vertical guide rails 56 on its front side. As shown by way of example in FIG. 8, the post 55 consists of a pair of side members 55A, a rear member 55B positioned between them, and a pair of side frames 55C positioned inside the rear member. Each of the guide rails 56 extends on the front side of one of the side frames 55C. The post 55 is also fitted with a top frame 57 (FIG. 7) on its top. Each of the side frames 55C is fitted with a cover 58 on its front side.

The transferrer 51 may include a lift 60 with a pair of vertical sliders 59 each in slidable engagement with one of the vertical guide rails 56. The lift 60 can be moved vertically by a vertical driver 61. In a particular embodiment, the lift 60 is L-shaped in side view, including a vertical member 60A and a horizontal member 60B. The vertical sliders 59 are fixed to the vertical member 60A, the lower end of which is fixed to the rear end of the horizontal member 60B.

The vertical driver 61 includes a pair of driving pulleys 62, a pair of driven pulleys 63, a pair of timing belts or other endless driving means 64, a pair of guide pulleys 65, and a rotational drive 66. Each pair of pulleys 62, 63 and 65 includes right and left pulleys. The rotational drive 66 is coupled to the driving pulleys 62, which are supported within the base frame 54 at the bottom of the post 55. The driven pulleys 63 are supported within the top frame 57 at the top of the post 55. Each of the timing belts 64 connects one of the driving pulleys 62 and one of the driven pulleys 63. The guide pulleys 65 are supported near the driving pulleys 62.

Each of the timing belts 64 consists of a lower part 64A and an upper part 64B, which are in engagement with the associated driving and driven pulleys 62 and 63 respectively. Each of the timing belts 64 is connected to one of the vertical sliders 59, each of which is interposed between one end of the associated lower belt part 64A and one end of the associated upper belt part 64B. A tension adjuster 67 is interposed between the other ends of the parts 64A and 64B of each timing belt 64. The rotational drive 66 is a combination of a reversible AC servo motor, a speed reducer, etc. The rotational drive 66 includes a driving shaft 68, to which the driving pulleys 62 are fixed, and to which a pulse encoder 66A (FIG. 11) is coupled.

The horizontal member 60B of the lift 60 supports a vertical shaft 71 on the transfer axis 52 with a bearing 72 interposed between them. The vertical shaft 71 supports a turning member 70 fixed to it. The turning member 70 has a horizontal center line and can be turned on the transfer axis 52 by an angular driver 73.

The angular driver 73 includes a rotational drive 74, a driving shaft 75, a driving pulley 76, a driven pulley 77, a timing belt or another endless driving means 78, and guide pulleys 79. The rotational drive 74 is fitted between the vertical and horizontal members 60A and 60B. The driving shaft 75 extends downward from the rotational drive 74. The driving and driven pulleys 76 and 77 are fixed to the driving and vertical shafts 75 and 71 respectively and connected by the timing belt 78. The guide pulleys 79 are supported in the horizontal member 60B. The rotational drive 74 includes a reversible stepping motor. The driven pulley 77 is fitted with five detection plates 80 fixed to it for detecting the direction of the carrier 81 on the turning member 70.

In a particular embodiment, the carrier 81 of the transferrer 51 may take the form of a fork and may be supported on the turning member 70 in such a manner that it can protrude and retract in parallel with the center line of the turning member 70. The carrier 81 consists of a horizontal supporting plate 81A and a shift regulating plate 81B. The supporting plate 81A is parallel with the center line of the turning member 70. The regulating plate 81B stands on a middle portion of the supporting plate 81A. The supporting plate 81A is fitted with positioning pins 82 as positioning means, which stand on it forward of the regulating plate 81B.

Figure 5:
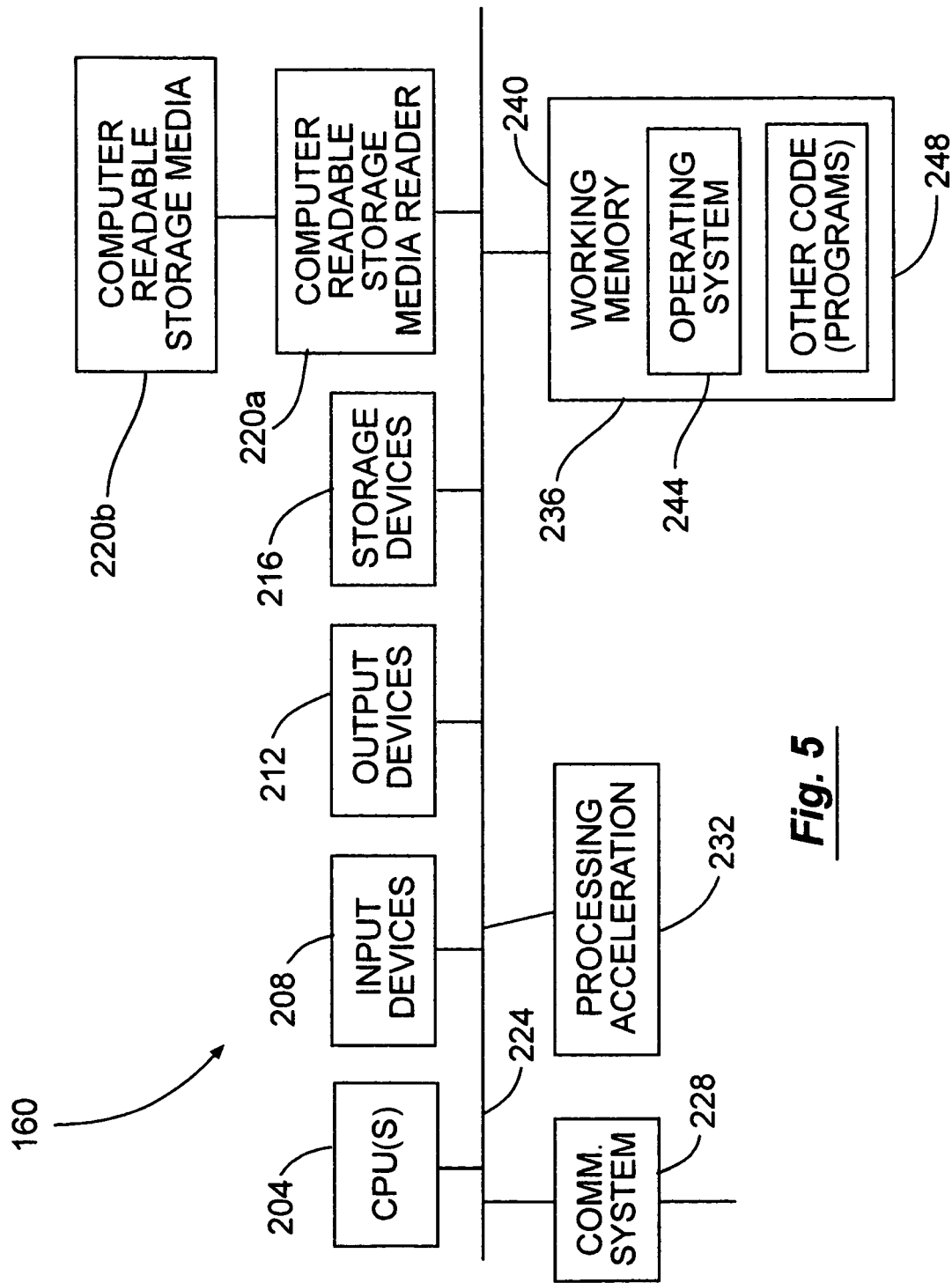
FIG. 5 is a side view partially in section of an upper portion of the rotary rack.
Figure 6:
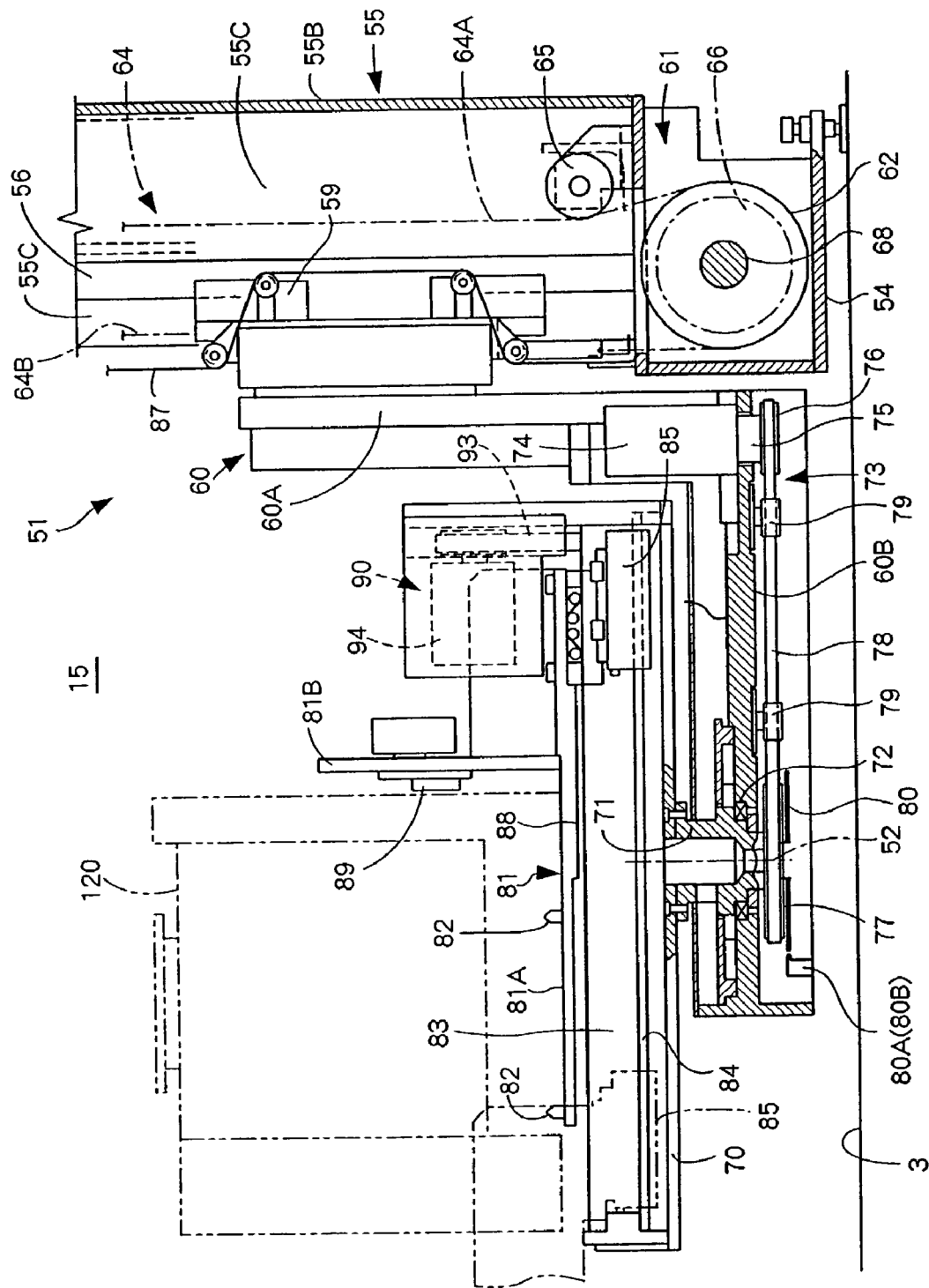
FIG. 6 is a side view partially in section of a lower portion of the transferrer of the storage apparatus.
Figure 7:
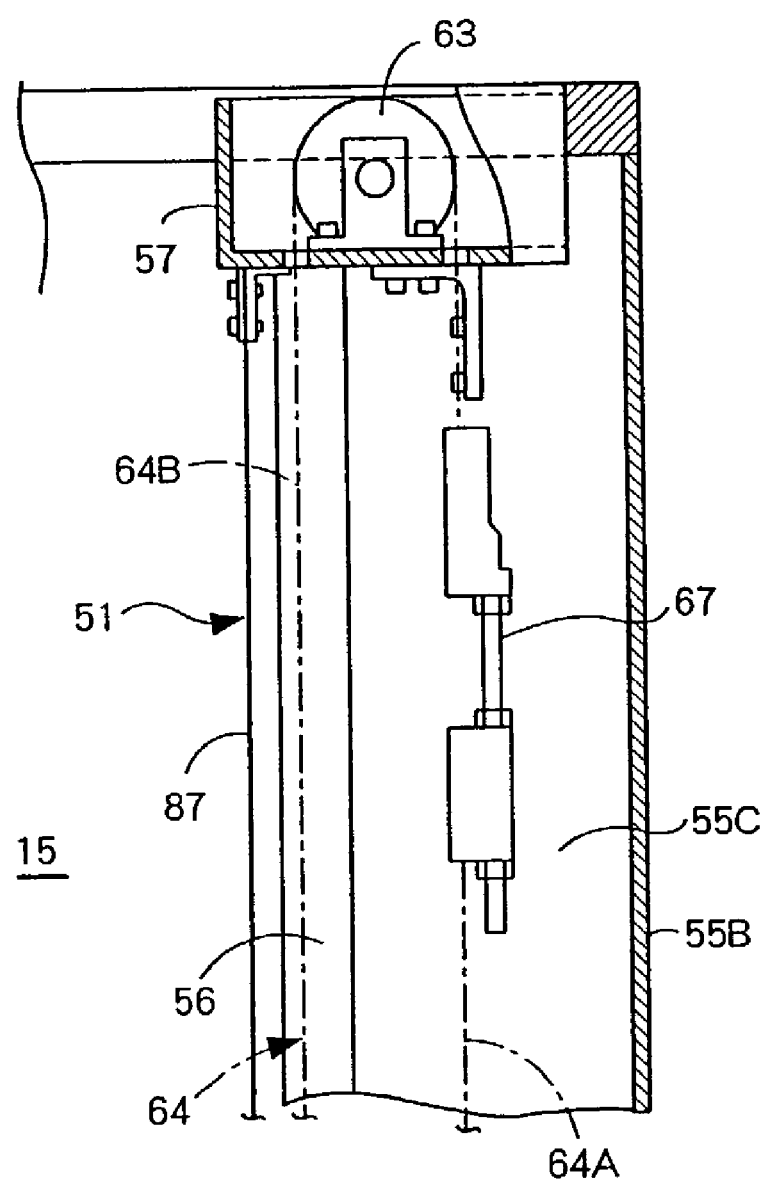
FIG. 7 is a side view partially in section of an upper portion of the transferrer.

The turning member 70 is fitted with a pair of horizontal rails 83 and a horizontal guide 84 that extend on it in parallel with its center line. The horizontal guide 84 extends through the transfer axis 52 between the horizontal rails 83. The rear end of the supporting plate 81A is fitted with a horizontal slider 85 as an LM guide on its bottom. The horizontal slider 85 is in slidable engagement with the horizontal guide 84. The shift regulating plate 81B is fitted with a photoelectric switch 89 for detecting the reflecting mirrors 36 and tapes 37 (FIG. 5).

Figure 11:
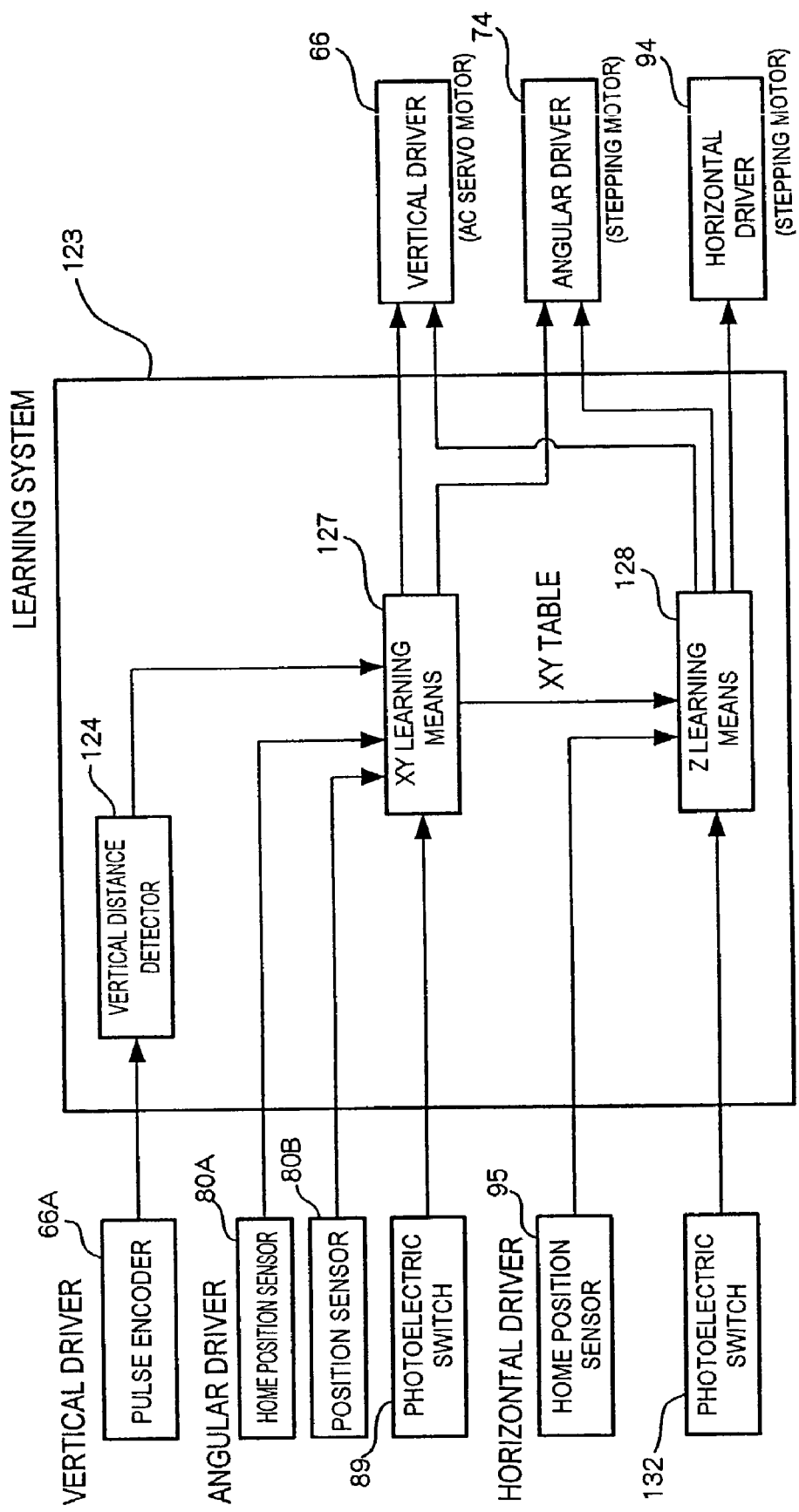
FIG. 11 is a block diagram of the learning system of the storage apparatus.

The carrier 81 of the transferrer 51 can be protruded and retracted in parallel with the center line of the turning member 70 by a horizontal driver 90, which includes a horizontal screw shaft 91, a nut 92, a belt transmission mechanism 93 and a rotational drive 94. The screw shaft 91 is supported along the horizontal guide 84 by the turning member 70, and is in engagement with the nut 92, which is fixed to the bottom of the carrier 81. The transmission mechanism 93 connects the screw shaft 91 and the rotational drive 94, which is mounted on the turning member 70. The rotational drive 94 includes a reversible stepping motor. The carrier 81 retracted into its home position over the turning member 70 can be detected by an HP sensor 95 (FIG. 11).

The supporting plate 81A of the carrier 81 can move vertically through the recesses 34 of the shelves 32. The post 55 is fitted with a dust belt 87 for closing the space between the covers 58. The dust belt 87 should not prevent the vertical sliders 59 from vertically moving. The turning member 70 is fitted with a dust belt 88 for closing the space over the horizontal guide 84. The dust belt 88 should not prevent the carrier 81 from moving back and forth.

In an exemplary embodiment, the components and/or parts 54–95 compose the transferrer 51. The carrier 81 of the transferrer 51 can turn around the vertical transfer axis 52. The carrier 81 operates on the cylindrical transfer path 53, which is in point contact with the cylindrical turning path 23.

As shown in FIGS. 1, 3, 9 and 10, the fixed racks 101 can be arranged on the cylindrical transfer path 53 in the storage chamber 15. Each of the fixed racks 101 includes horizontal flat bars 102, which extend in the housing 11 and are fixed to the framework 12. The flat bars 102 are positioned at vertical intervals outside the transfer path 53. Each of the flat bars 102 supports a shelf 103 as a load support, which is fixed at one end with connectors 104 to the bar and protrudes in the form of a cantilever toward the transfer axis 52.

Each of the shelves 103 has a recess 105, which is open vertically and toward the transfer axis 52. Each shelf 103 is fitted with one or more (for example, three, in the drawings) positioning pins 106, which stand on it around the associated recess 105. The supporting plate 81A of the carrier 81 of the transferrer 51 can move vertically through the recesses 105 of the shelves 103. The components and/or parts 102–106 compose the fixed racks 101.

Each of the shelves 103 is fitted with a reflecting mirror 107 as part of a load detector on its fixed end and a reflecting tape 108 as part of a level detector on its free end. The specular surfaces of the reflecting mirror 107 and tape 108 are oriented toward the transfer axis 52. The reflecting mirror 107 and tape 108 can be detected by the photoelectric switch 89 of the transferrer 51.

Figure 8:
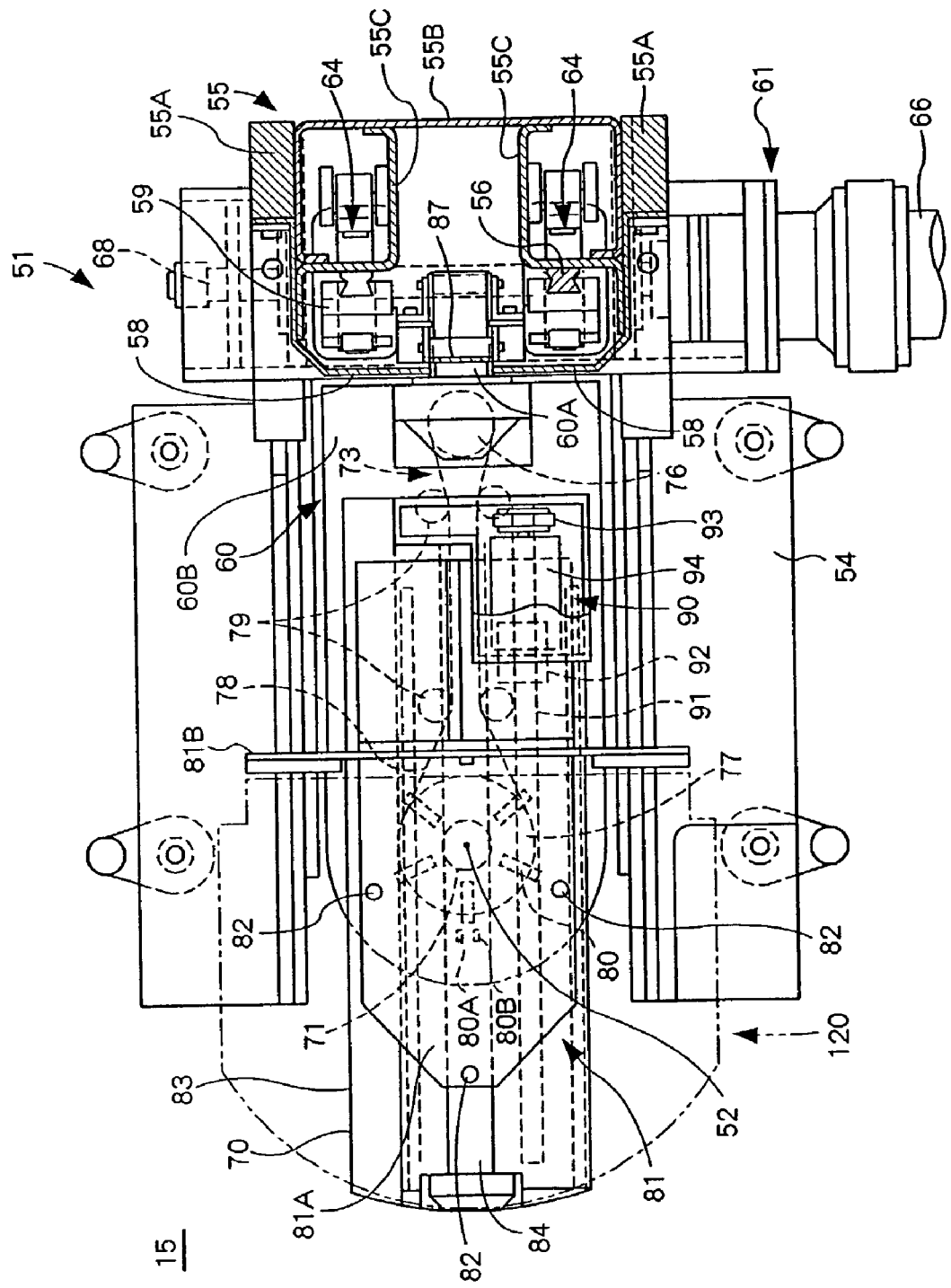
FIG. 8 is a top plan partially in section of the transferrer.
Figure 9:
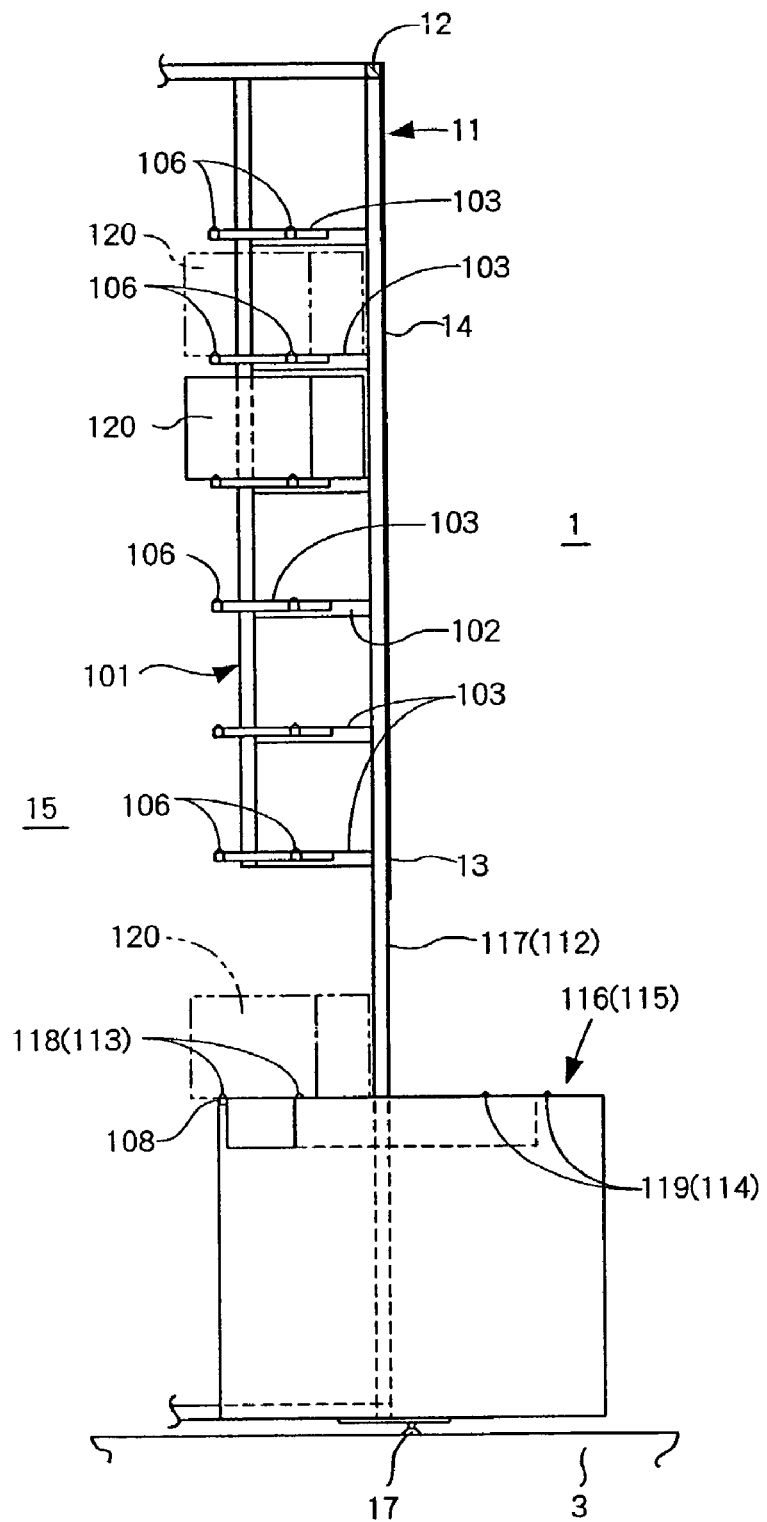
FIG. 9 is a side view of one of the fixed racks of the load storage apparatus.
Figure 10:
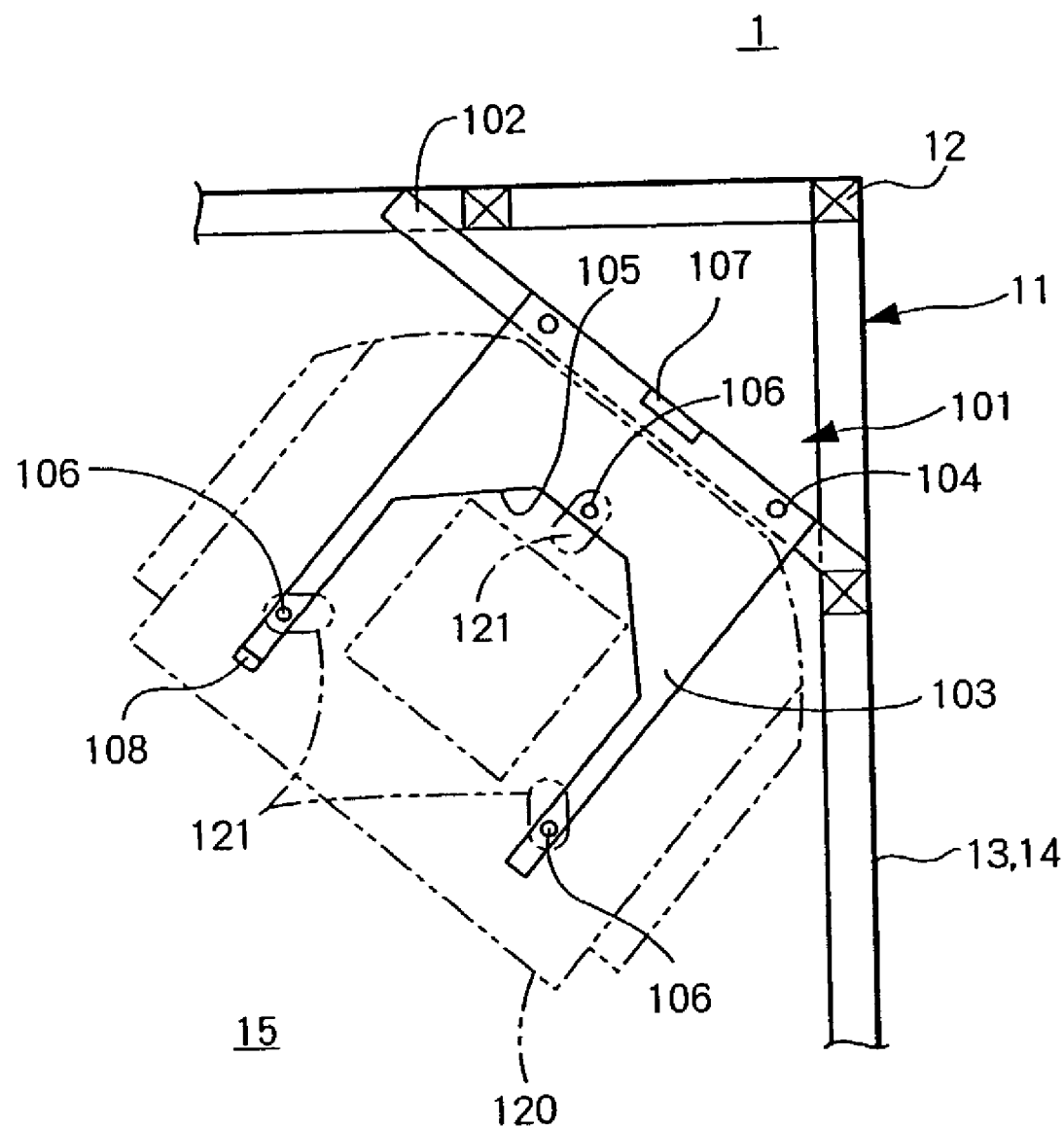
FIG. 10 is a top plan of one of the fixed racks.

The detection plates 80 of the transferrer 51 are oriented radially with respect to the transfer axis 52. One of the five detection plates 80 is associated with the rotary rack 21. This detection plate 80 is positioned between the transfer axis 52 and the front end of the turning member 70, and parallel with the center line of the turning member 70. Each of the other four detection plates 80 is in such an angular position that it is aligned with the shelves 103 of one of the fixed racks 101 when the detection plate 80 for the rotary rack 21 is oriented to the rack axis 22, as shown in FIG. 8. The horizontal member 60B of the lift 60 is fitted with a home position sensor 80A for detecting the detection plate 80 for the rotary rack 21 and a position sensor 80B for detecting the detection plates 80 for the fixed racks 101.

As shown in FIGS. 1–3 and 9, in an exemplary embodiment, the storage apparatus 10 is formed with an inlet port 111 and an outlet port 116 both near the fixed racks 101. The lower wall 13 of the housing 11 is formed with an inlet opening 112 and an outlet opening 117 both through it, through which the ports 111 and 116 respectively extend between the outside and the inside of the housing 11.

Lower portions of the two rear fixed racks 101 are fitted with no shelves 103. Inner end portions of the ports 111 and 116 bend in plan view and each open into one of the lower portions of the rear fixed racks 101.

The inner end portions of the ports 111 and 116 are similar in structure to the shelves 103 of the fixed racks 101 and can cooperate with the transferrer 51. These portions of the ports 111 and 116 are fitted with inner positioning pins 113 and 118 respectively. Outer end portions of the ports 111 and 116 are fitted with outer positioning pins 114 and 119 respectively. The positioning pins 113, 118, 114 and 119 are similar to the positioning pins 106 of the shelves 103. The ports 111 and 116 are fitted with belt conveyors (not shown) or other conveyers, which can vertically move. Each of the inner ends of the ports 111 and 116 is fitted with a reflecting tape 108 as part of a level detector. The reflecting tapes 108 of the ports are similar to those of the shelves 103. The specular surfaces of the reflecting tapes 108 are oriented toward the transfer axis 52. The reflecting tapes 108 can be detected by the photoelectric switch 89 of the transferrer 51.

As previously stated, the rotary rack 21, the transferrer 51 and the fixed racks 101 may be provided in the storage chamber 15, which is kept clean. The shelves 32 of the rotary rack 21 are arranged along the cylindrical turning path 23 and at vertical intervals, and can turn together. The fixed shelves 103 of the fixed racks 101 are arranged along the cylindrical transfer path 53 and at vertical intervals. The transferrer 51 can operate for each of the rack shelves 32 and 103 at different heights. Cassettes 120 can be transferred by the transferrer 51 and stored in the racks 21 and 101. Each of the cassettes 120 has grooves, slots or the like 121 formed in its bottom for engaging with the positioning pins 35, 82, 106, 113, 114, 118 and 119.

The storage apparatus 10 can be used, for example, in the following way.

The downflow system keeps the clean room 1 clean by causing the clean air A supplied through the ceiling 2 into the room to be discharged downward through the floor 3. Part of the supplied clean air A flows downward through the storage chamber 15 to keep this chamber clean.

The process for loading the storage apparatus 10 with a cassette 120 includes the first step of placing the cassette in the outer end portion of the inlet port 111 manually or by means of a warehousing apparatus in such a manner that the bottom grooves 121 of the cassette engage with the outer positioning pins 114 of the port. The conveyor of the inlet port 111 lifts the placed cassette 120, conveys the lifted cassette through the inlet opening 112 and positions the conveyed cassette in the inner end portion of the inlet port 111. The conveyor lowers the positioned cassette 120 in such a manner that the bottom grooves 120 engage with the inner positioning pins 113 of the port.

The transferrer 51 receives the cassette 120 from the inner end portion of the inlet port 111. The reception involves turning and vertically moving the carrier 81 of the transferrer 51, with the carrier 81 emptied and retracted into its home position over the turning member 70, as shown with solid lines in FIG. 6. The turning and the vertical movement of the carrier 81 may be carried out at the same time, or one of them may be carried out before the other.

The carrier 81 can be turned with the turning member 70 in opposite directions around the transfer axis 52 by the rotational drive 74 of the angular driver 73, which drives the driving shaft 75, the driving pulley 76, the endless belt 78, the driven pulley 77 and the vertical shaft 71 in opposite directions.

The carrier 81 can be moved vertically with the vertical sliders 59 and the lift 60 by the rotational drive 66 of the vertical driver 61, which drives the driving shaft 68, the driving pulleys 62 and the endless belts 64 in opposite directions.

Thus, by turning and vertically moving the carrier 81, it is possible to position this means in front of and slightly below the inner end portion of the inlet port 111.

The positioned carrier 81 can be protruded from its home position by the rotational drive 94 of the horizontal driver 90, which drives the belt transmission mechanism 93 and the screw shaft 91, moving the nut 92. The carrier 81 protrudes linearly with the horizontal slider 85 guided by the horizontal guide 84. As a result, the supporting plate 81A of the carrier 81 can be positioned just under the cassette 120 placed in the inner end portion of the inlet port 111.

The vertical driver 61 drives the lift 60 etc. to lift the positioned carrier 81 slightly through the recess in the inner end portion of the inlet port 111. While the carrier 81 is lifted, it lifts the placed cassette 120, with its positioning pins 82 engaging with the bottom grooves 121 of the cassette 120. The lifted cassette 120 can be moved into a position over the turning member 70 by the horizontal driver 90 operating in the opposite direction to retract the carrier 81.

In a manner similar to the foregoing, the retracted carrier 81 can be turned and/or vertically moved with the turning member 70 to be positioned in the unloading position in front of and slightly above one of the shelves 103 of the fixed racks 101.

In a manner similar to the foregoing, the positioned carrier 81 can be protruded from its home position to move the cassette 120 on it to a position just over the shelf 103. The carrier 81 over the shelf 103 can be lowered slightly through the recess 105 of the shelf to transfer the cassette 120 onto the shelf 103 in such a manner that the bottom grooves 121 of the cassette can engage with the positioning pins 106 of the shelf. The subsequent retraction of the lowered carrier 81 completes the process for loading the shelf 103 with the cassette 120 placed in the inner end portion of the inlet port 111.

It is alternatively possible to load the rotary rack 21 with the cassette 120 in the inner end portion of the inlet port 111 by turning this rack in advance while the transferrer 51 is receiving the cassette from this port.

The rotary rack 21 can be turned in opposite directions around the rack axis 22 by the rotational drive 42 of the rack driver 41, which drives the driving shaft 43, the driving gear 44, the ring gear 45, the vertical shaft 27, etc. This revolves the shelves 32 on the cylindrical turning path 23. When a target shelf 32 reaches the transfer position crossing the cylindrical transfer path 53, the turning rack 21 is stopped.

It is possible to move the target shelf 32 to the transfer position efficiently by turning the rotary rack 21 within an angular range of 180 degrees in the direction for the smaller angle between the current position of the target shelf and the transfer position. It is also possible to raise the overall operating efficiency by turning the rotary rack 21 in advance while the transferrer 51 is receiving the cassette 120. As a matter of course, if the target shelf 32 is already in the transfer position, the rotary rack 21 does not have to be turned.

As shown in FIGS. 1 and 5, when the target shelf 32 is stopped in the transfer position, the cassette 120 on the carrier 81 can be transferred onto this shelf by the transferrer 51 operating in a manner similar to the foregoing. The cassette 120 can thus be transferred in such a manner that its bottom grooves 121 engage with the positioning pins 35 of the shelf 32. This completes the process for loading the shelf 32 with the cassette 120 in the inner end portion of the inlet port 111.

Each of the cassettes 120 stored in the fixed racks 101 can be transferred to and stored on any one of the shelves 32 of the rotary rack 21 by the operation of the transferrer 51 and the turning of the rotary rack. It is possible to raise the overall operating efficiency of the transfer and storage by turning the rotary rack 21 in advance while the transferrer 51 is receiving the cassette 120 from the fixed rack 101 storing the cassette. In this case, too, it the target shelf 32 is already in the transfer position, the rotary rack 21 is not turned.

The racks 21 and 101 can be unloaded by the transferrer 51 operating in the reverse order. Specifically, each of the cassettes 120 supported in the racks 21 and 101 can be moved to an inner end portion of the outlet port 116. The cassette 120 in the inner end portion of the outlet port 116 can be conveyed through the outlet opening 117 to an outer end portion of this port 116 by the conveyor fitted in the port 116. This completes the unloading process.

Each of the cassettes 120 stored in the rotary rack 21 can be transferred to and stored in any one of the fixed racks 101 likewise by the operation of the transferrer 51 and the turning of the rotary rack 21.

In an exemplary embodiment, during the loading and unloading processes, the bottom grooves 121 of each cassette 120 engage with the positioning pins 35, 82, 106, 113, 114, 118 or 119. This prevents the cassette 120 from coming into accidental contact with another cassette or a part of the apparatus, transferring abnormally, falling down or having another accident by shifting out of position with centrifugal force or otherwise.

As previously stated, the transferrer 51 does not travel, but its carrier 81 turns on the transfer axis 52. Consequently, the transferrer 51 needs no space in which to travel, and the whole apparatus 10, inclusive of the racks 21 and 101, can be compact. In addition, it is easy to increase the number of cassettes 120 that can be stored in the whole apparatus 10, and to install the storage apparatus 10 in the clean room 1 or another clean space that should be as narrow as possible.

The downflow of clean air A within the housing 11 can quickly remove the dust on the rotary rack 21, the transferrer 51, etc. This keeps the storage chamber 15 sufficiently clean, making it suitable for the storage of cassettes 120 or other items that need storing in a clean environment.

The storage apparatus 10 loads and unloads cassettes 120 by turning, lifting, lowering, protruding and retracting the carrier 81 of the transferrer 51 with respect to the shelves 32 and 103 of the racks 21 and 101 and the ports 111 and 116 after learning the angular positions of the shelves 32 and 103 and the ports 111 and 116, the vertical distance between the carrier 81 and its lowering limit, and the horizontal distance for which the carrier 81 protrudes and retracts. The learning involves correcting the values set when the storage apparatus 10 was designed. FIG. 11 is a block diagram of an exemplary learning system 123, which for example is a computer, for correcting the set values.

The learning system 123 includes a vertical distance detector 124, an XY learning means 127 and a Z learning means 128. The rotational drive 66 of the vertical driver 61 is fitted with a pulse encoder 66A. The distance detector 124 determines the vertical distance between the carrier 81 and its lowering limit by counting the pulses output from the pulse encoder 66A.

The XY learning means 127 learns the vertical distance (X-coordinate value) for which the carrier 81 moves vertically from a vertical reference position, and the angle (Y-coordinate value) for which the carrier 81 turns from an angular reference position, for each of the shelves 32 in the transfer position on the transfer path 53, the shelves 103, and the ports 111 and 116. The vertical reference position may be the position of the carrier 81 at the time when the lift 60 is in its lowest position. The angular reference position may be the position of the carrier 81 oriented toward the rack axis 22. When the carrier 81 is in the angular reference position, the home position sensor 80A detects the detection plate 80 for the rotary rack 21.

In an exemplary embodiment, the vertical distances (X-coordinate values) for the shelves 32 of the rotary rack 21 can be learned in the following process. First, the carrier 81 in the vertical reference position is turned. When the home position sensor 80A detects the detection plate 80 for the rotary rack 21, the turned carrier 81 is stopped. This orients the carrier 81 in such a direction that it can load and unload the rotary rack 21. Then, the lift 60 lifts the oriented carrier 81. When the lifted carrier 81 approaches each of the shelves 32 in the transfer position on the transfer path 53, the photoelectric switch 89 on the carrier 81 detects the reflecting tape 37 on the shelf 32. When the reflecting tape 37 is detected, the vertical distance between the carrier 81 and the vertical reference position is read out from the vertical distance detector 124. The vertical distances read out for the column of shelves 32 in the transfer position are then stored. It should be noted that any suitable switch and detecting mechanism known in the art may be used in the present invention.

After the vertical distances for one column of shelves 32 of the rotary rack 21 are learned, this rack 21 is turned for a predetermined angle so that one of the next columns of shelves 32 shifts to the transfer position. Then, the vertical distances for this column of shelves 32 are stored in the same way. This process is repeated for all the columns of shelves 32.

In an exemplary embodiment, the vertical distances (X-coordinate values) for the shelves 103 of the fixed racks 101 can be learned in the following process. While the carrier 81 is turned, the position sensor 80B detects the four detection plates 80 for the fixed racks 101 in order. When the detection plate 80 for one of the fixed racks 101 is detected, the turned carrier 81 is stopped. Then, in a manner similar to that for the rotary rack 21, the carrier 81 is lifted from the vertical reference position. When the photoelectric switch 89 on the transferrer 51 detects the reflecting tape 108 on each shelf 103 of this fixed rack 101, the vertical distance between the carrier 81 and the vertical reference position is read out from the vertical distance detector 124. The vertical distances read out for all of the shelves 103 of the fixed rack 101 are then stored. If the fixed rack 101 is positioned over the inlet port 111 or the outlet port 116, the vertical distances read out for the port 111 or 116 and the shelves 103 are stored.

After the vertical distances for the shelves 103 of one fixed rack 101 are learned, the carrier 81 is turned again. The turned carrier 81 is stopped again when the position sensor 80B detects the detection plate 80 for one of the next fixed racks 101. Then, the vertical distances for all the shelves 103 of this fixed rack 101 are learned and stored.

After the vertical distances (X-coordinate values) for all of the shelves 32 and 103 and the ports 111 and 116 are thus learned and stored, the angle (Y-coordinate value) between the carrier 81 and the angular reference position for each of the shelves and ports is learned.

In an exemplary embodiment, first, on the basis of the learned and stored vertical distances (X-coordinate values), the carrier 81 may be lifted from the vertical reference position to the first (lowest) stage of shelves 32 and 103, and stopped at this stage. While the carrier 81 is turned at the lowest stage of shelves, the photoelectric switch 89 on the carrier 81 sequentially detects the reflecting tapes 37 and 108 of the shelf 32 in the transfer position and the shelves 103 respectively at this stage. In the meantime, the sensors 80A and 80B detect the detection plates 80. When the home position sensor 80A detects the detection plate 80 for the rotary rack 21, that is, when the carrier 81 is in the angular reference position, the pulses output to the rotational drive 74 are counted. The number of pulses counted when the photoelectric switch 89 detects each of these tapes 37 and 108 is stored as the angle between the angular reference position and the carrier 81 for the associated shelf 32 or 103.

After the angles for the first stage of shelves 32 and 103 are learned, the carrier 81 may be lifted from the vertical reference position to the second stage of shelves 32 and 103 on the basis of the learned and stored vertical distances, and stopped at this stage. Thereafter, in a manner similar to the foregoing, the angle between the angular reference position and the carrier 81 for each of the shelf 32 in the transfer position and the shelves 103 all at the second stage of shelves is learned and stored. For the stage of shelves 32 and 103 at the level of the ports 111 and 116, the angles for the appropriate shelves 32 and 103 and the ports 111 and 116 are learned and stored.

The carrier 81 is fitted with one photoelectric switch 89 as an exemplary sensor or detector for use in the learning processes. The photoelectric switch 89 could be replaced with a sensor for the learning of vertical distances and a sensor for the learning of angles. These sensors may be fitted at points suitable for the detection of the reflecting tapes 37 and 108, or the like.

The learned values, particularly the vertical distances (X-coordinate values) are mere reference distances and angles viewed from the carrier 81. Accordingly, it depends on the positions of the reflecting tapes 37 and 108 and the photoelectric switch 89 whether the learned vertical distances correspond to the loading levels or the unloading levels, or are the mere reference levels, for the shelves 32 and 103 and the ports 111 and 116. It is necessary to stop the carrier 81 at the loading and unloading levels. Accordingly, it may be necessary to add a value to and subtract a value from each of the learned vertical distances in order to determine the actual vertical distances for loading and unloading the associated shelf 32 or 103. The found distances are stored as final learned values.

After the vertical distances (X-coordinate values) and the angles (Y-coordinate values) for all of the shelves 32 and 103 and the ports 111 and 116 are learned, an XY table is prepared. The table preparation is followed by the learning of the horizontal distance (Z-coordinate value) for which the carrier 81 protrudes toward each of the shelves 32 in the transfer position, the shelves 103, and the ports 111 and 116.

Figure 12:
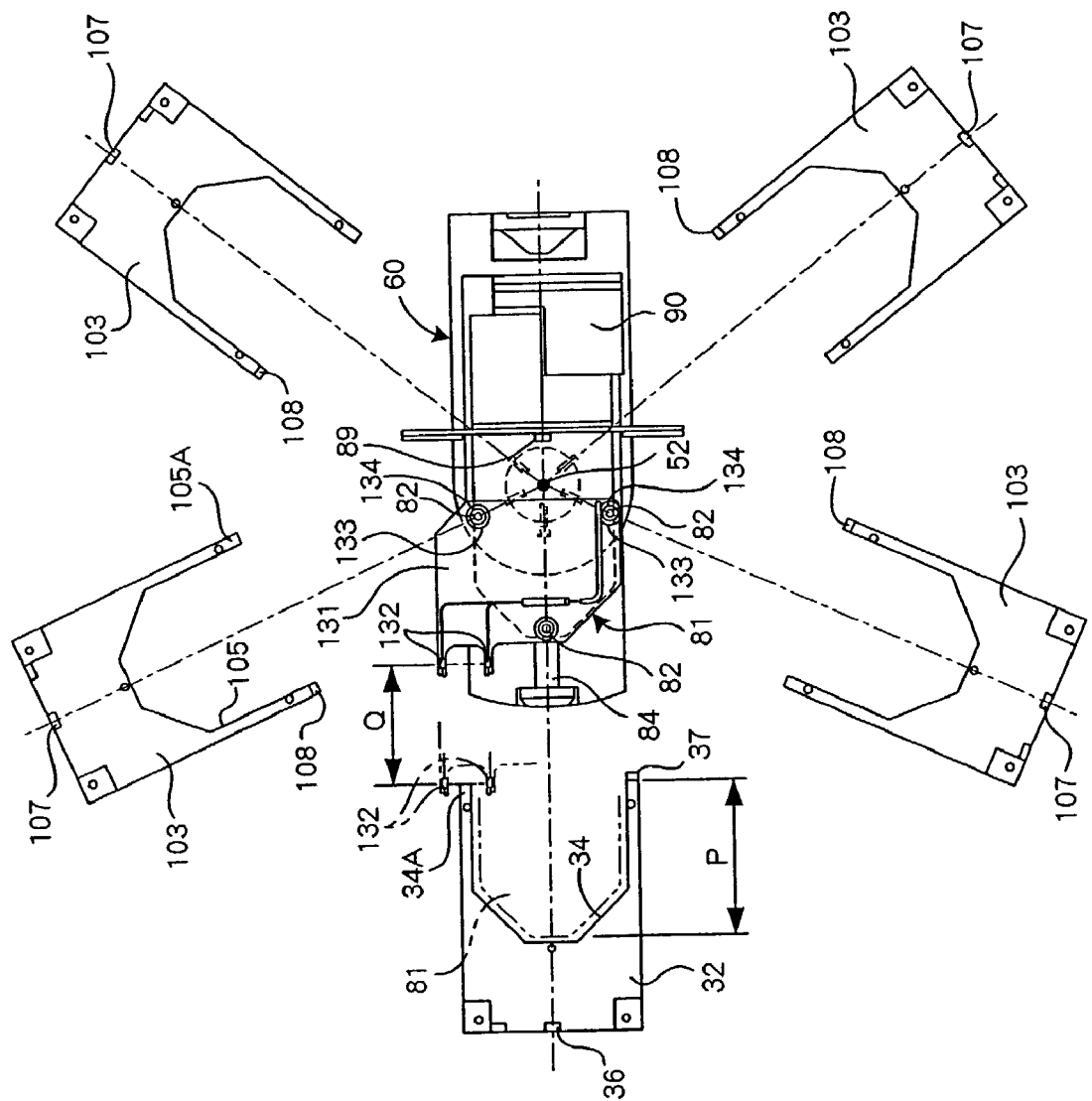
FIG. 12 shows how a teaching unit is mounted on the carrier of the transferrer.

The Z learning means 128 determines the horizontal distance for which the carrier 81 protrudes toward and retracts from each of the shelves 32 and 103 around it and the ports 111 and 116. As shown in FIG. 12, the horizontal distance can be learned by means of for example a fork teaching unit 131, which can be fixed in position with the positioning pins 82 on the carrier 81. In an exemplary embodiment, the teaching unit 131 is fitted with a photoelectric switch 132 as a sensor or detector.

With the carrier 81 retracted and aligned with each of the shelves 32 and 103 around it and the ports 111 and 116, the carrier 81 is protruded for a predetermined distance from its retracted position. When the carrier 81 is protruded, a predetermined point of each of these shelves 32 and 103 and ports 111 and 116 is detected by intercepting the optical axis of the photoelectric switch 132. For example, the predetermined point is one outer end 34A of each shelf 32, one inner end 105A of each shelf 103 or one inner end of the port 111 or 116. The teaching unit 131 has bottom holes 133 each formed for engaging with one of the positioning pins 82 of the carrier 81. The teaching unit 131 can be mounted detachably on the carrier 81, with jigs 134 each fixing one of the positioning pins 82 in the associated bottom hole 133.

In an exemplary embodiment, the horizontal distance for which the carrier 81 protrudes toward each of the shelves 32 and 103 around it and the ports 111 can be learned by the Z learning means 128 in the following process. Firstly, the fork teaching unit 131 is fixed on the carrier 81, as stated above. Subsequently, with the carrier 81 in its horizontal reference position, where the home position sensor 95 is activated, the carrier 81 is aligned angularly with one of the shelves 32 and 103 around it and the ports 111 and 106 by the activation of the rotational drives 66 and 74 of the vertical and angular drivers 61 and 73 respectively on the basis of the XY table found out by the XY learning means 127. Next, pulses activate the rotational drive 94 of the horizontal driver 90 to protrude the carrier 81. When the photoelectric switch 132 on the protruded carrier 81 is activated, the number of output pulses is measured. This number represents the horizontal distance Q (FIG. 12) for which the carrier 81 has moved from the horizontal reference position until the photoelectric switch 132 detects the end 34A or 105A. The distance Q is then stored. Subsequently, the stored distance Q is added to the predetermined distance P (FIG. 12) between the end 34A or 105A and a predetermined position, where the carrier 81 can load and unload a cassette 120, in the associated recess 34 or 105. The sum of the distances P and Q is the horizontal distance for which the carrier 81 should protrude for the shelf 32 or 103 or the port 111 or 116.

This learning process can be carried out for all of the shelves 32 and 103 and the ports 111 and 116 so that the horizontal distance as the Z-coordinate value for which the carrier 81 should protrude from the horizontal reference position for each of the shelves 32 and 103 and the ports 111 and 116 can be learned and stored. After the learning process is carried out, the fork teaching unit 131 can be removed from the carrier 81.

Thus, the learning processes are completed for all of the shelves 32 and 103 and the ports 111 and 116. This makes the carrier 81 ready for safely and accurately loading and unloading the shelves 32 and 103 and the ports 111 and 116, with the vertical, angular and horizontal drivers 61, 73 and 90 controlled automatically on the basis of the learned and stored X-coordinate, Y-coordinate and Z-coordinate values. Each of the X-coordinate values is the vertical distance for which the carrier 81 rises for one of the shelves and ports from the vertical reference position. Each of the Y-coordinate values is the angle for which the carrier 81 turns for one of the shelves and ports from the angular reference position. Each of the Z-coordinate values is the horizontal distance for which the carrier 81 protrudes for one of the shelves and ports from the horizontal reference position.

The carrier 81 does not always start loading or unloading from the vertical and angular reference positions. For example, the carrier 81 stopping in a position after loading one of the shelves 32 and 103 and the ports 111 and 116 may start operating to unload another. In this case, a comparison operation is executed between the X-coordinate values learned and stored for the current position of the carrier 81 and the position to which this means should vertically move for the next shelf or port, and another comparison operation is executed between the Y-coordinate values learned and stored for the current position and the position to which the carrier 81 should turn for the next shelf or port. The differences between the X-coordinate values and between the Y-coordinate values are the bases for vertically moving and turning the carrier 81.

Figure 13:
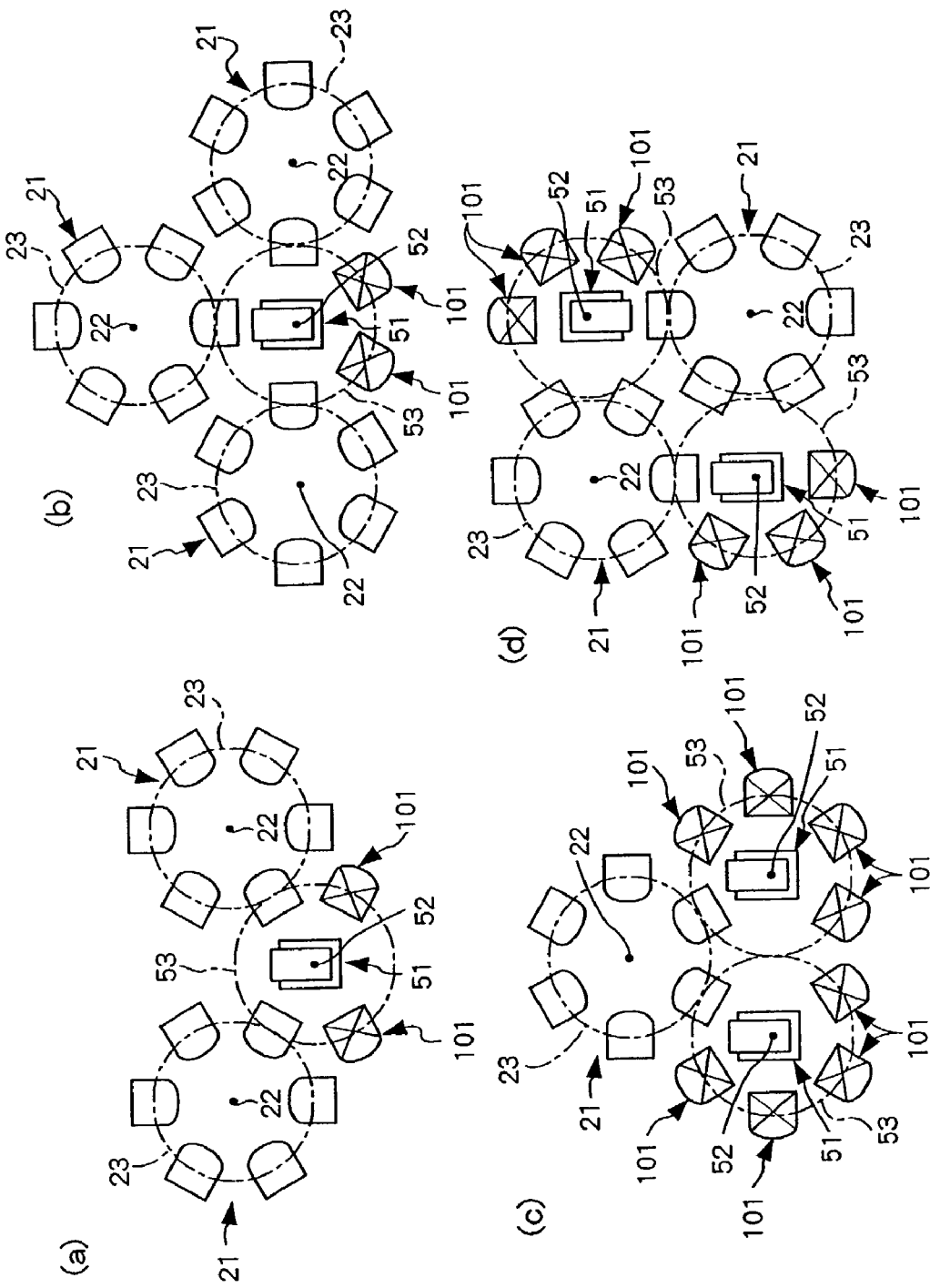
FIG. 13(a) is a schematic top plan of a load storage apparatus according to a second embodiment of the present invention.
FIG. 13(b) is a schematic top plan of a load storage apparatus according to a third embodiment of the present invention.
FIG. 13(c) is a schematic top plan of a load storage apparatus according to a fourth embodiment of the present invention.
FIG. 13(d) is a schematic top plan of a load storage apparatus according to a fifth embodiment of the present invention.

FIG. 13(a) shows a load storage apparatus according to a second embodiment of the present invention. This apparatus includes two rotary racks 21 each having a cylindrical turning path 23, one transferrer 51 having a cylindrical transfer path 53, and two fixed racks 101. The transferrer 51 is positioned between the rotary racks 21. The fixed racks 101 are positioned on the transfer path 53.

FIG. 13(b) shows a load storage apparatus according to a third embodiment of the present invention. This apparatus includes three rotary racks 21 each having a cylindrical turning path 23, one transferrer 51 having a cylindrical transfer path 53, and two fixed racks 101. The transferrer 51 is positioned between two of the rotary racks 21 and side by side with the other rotary rack 21. The fixed racks 101 are positioned on the transfer path 53.

FIG. 13(c) shows a load storage apparatus according to a fourth embodiment of the present invention. This apparatus includes one rotary rack 21 having a cylindrical turning path 23, two transferrers 51 each having a cylindrical transfer path 53, and eight fixed racks 101. The rotary rack 21 is positioned on one side of the position between the transferrers 51. Four of the fixed racks 101 are positioned on each of the transfer paths 53.

FIG. 13(d) shows a load storage apparatus according to a fifth embodiment of the present invention. This apparatus includes two rotary racks 21 each having a cylindrical turning path 23, two transferrers 51 each having a cylindrical transfer path 53, and six fixed racks 101. The rotary racks 21 are positioned alternately with the transferrers 51. The axial plane extending between the axes 22 of the rotary racks 21 crosses that extending between the axes 52 of the transferrers 51. Three of the fixed racks 101 are positioned on each of the transfer paths 53.

In each of the embodiments, the turning member 70 of the or each transferrer 51 can turn on the transfer axis 52. Alternatively, the whole of the transferrer 51, inclusive of the carrier 81, could turn on a transfer axis extending through the post 55.

In each of the embodiments, two or more fixed racks 101 are positioned on the or each cylindrical transfer path 53. Alternatively, one fixed rack 101 might be positioned on the transfer path 53.

In each of the embodiments, each rotary rack 21 can turn for an angle of 180 or fewer degrees in opposite directions. Alternatively, the rotary rack 21 could turn in one direction or for an angle larger than 180 degrees in opposite directions.

In each of the embodiments, while the or each transferrer 51 is operating for the or each rotary rack 21, the rotary rack 21 turns ahead in preparation for loading or unloading. Alternatively, after the transferrer 51 operates for the rotary rack 21, the rotary rack 21 may turn in preparation for loading or unloading.

In each of the embodiments, each of the inlet and outlet ports 111 and 116 is positioned under one of the fixed racks 101 (FIGS. 13(a)/(b)) or the two fixed racks 101 that are the farthest from the rotary rack or racks 21. Alternatively, each of the ports 111 and 116 might be positioned under either the fixed rack 101 nearest to the rotary rack/s 21 or the fixed rack 101 that is the farthest from the rotary rack/s 21. In this case, one inlet port 111 and one outlet port 116 could be provided on each side.

Figure 14:
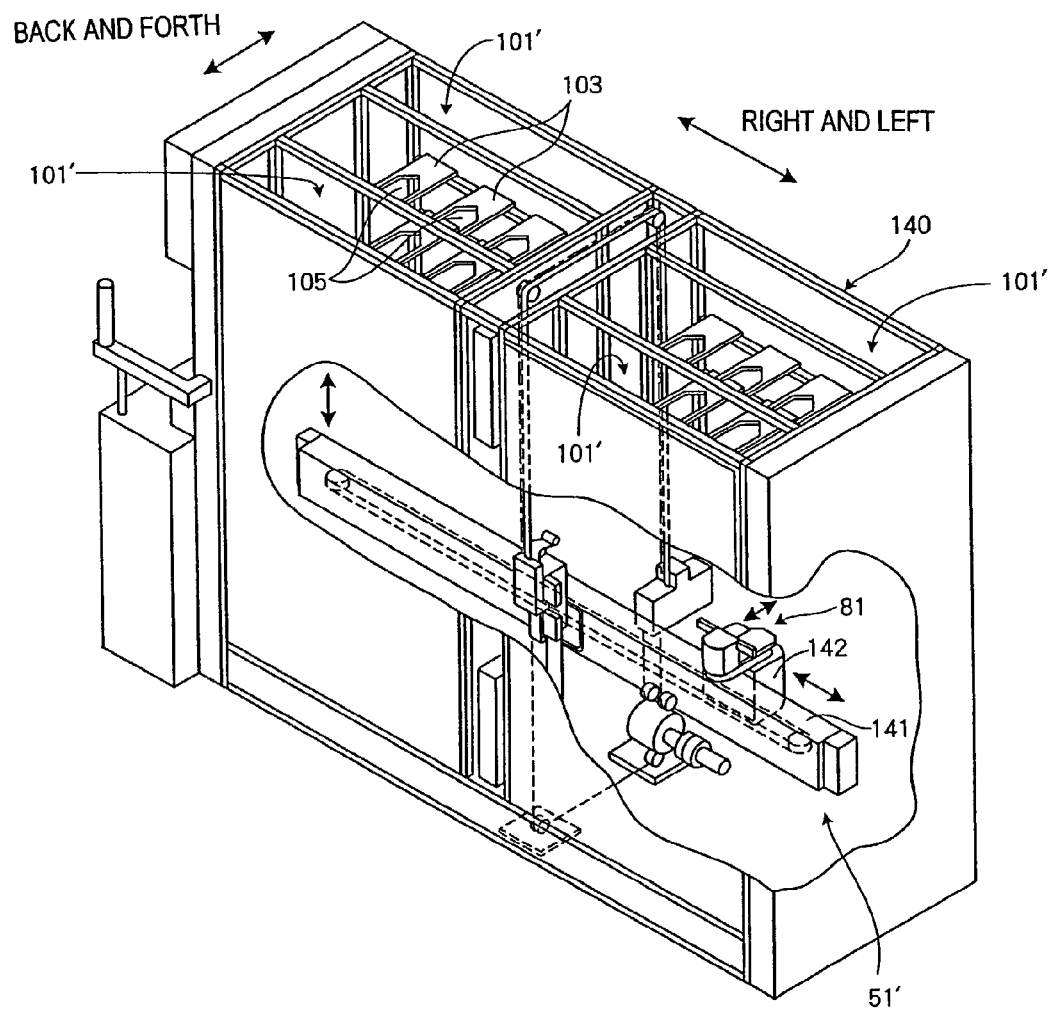
FIG. 14 is a partially cutaway perspective view of a load storage apparatus according to a sixth embodiment of the present invention.

FIG. 14 shows a load storage apparatus 140 according to a sixth embodiment of the present invention. The load storage apparatus 10 according to each of the previous embodiments includes one or more rotary racks 21, one or more transferrers 51 and fixed racks 101. The load storage apparatus 140 includes no rotary rack, a transferrer 51' and two fixed racks 101'. The fixed racks 101' are positioned in front and back of the transferrer 51' and each include a number of shelves 103 arranged laterally side by side. The shelves 103 are similar to those of the fixed racks 101 and each have a recess 105. The transferrer 51' includes a lift 141, a carriage 142 and a carrier 81. The lift 141 extends horizontally in the passage formed between the fixed racks 101' and is nearly equal in length to the passage. The lift 141 can vertically reciprocate and supports the carriage 142. The carriage 142 can reciprocate along the passage and supports the carrier 81. The carrier 81 can reciprocate across the passage to transfer cassettes 120 onto and from the shelves 103.

Similarly to the first embodiment, the horizontal distance for which the carrier 81 of the load storage apparatus 140 protrudes and retracts can be learned with a fork teaching unit 131 as shown in FIG. 12. This makes it possible to transfer the cassettes 120 without hindrance even if the positioning pins 106 of each shelf 103 shift slightly relative to those of the upper or lower shelf or shelves 103 when the weight of the cassettes 120 warps or deforms the rack 101'. Also, this removes the need for an operator to adjust the protruding/retracting distance for which to move a cassette 120 horizontally toward or away from each of the shelves 103 before the load storage apparatus starts to operate. Consequently, it is possible to adjust the protruding/retracting distance automatically and efficiently and avoid different operators' various adjustments.

In each of the embodiments, the carrier 81 of the or each transferrer 51 cooperates with the bottom of each cassette 120. Alternatively, each cassette 120 may include a part protruding laterally from its one side or top. The carrier 81 could be adapted to engage with the protruding part.

The load storage apparatuses according to the embodiments may store pallets for conveyance or the like, in place of the cassettes 120.

In each of the embodiments, the photoelectric switch 132 of the fork teaching unit 131 detects the inner ends 34A of the shelves 32, the outer ends 105A of the shelves 103 and one outer end of each of the ports 111 and 116. The photoelectric switch 132 can be replaced with a proximity switch or another sensor. The method for measuring with the fork teaching unit 131 the distance for which the carrier 81 protrudes and retracts can be used to measure the distance for which the fork protrudes and retracts in an automatic warehouse fitted with a stacker crane.

In each of the embodiments, the rotary rack/s 21, the transferrer/s 51 or 51' and the fixed racks 101 or 101' may be fitted in a clean atmosphere. Alternatively, the racks and the transferrer/s could be fitted in a common or general place without an atmosphere purifier.

Having now described one or more exemplary embodiments of the invention, it should be apparent to those skilled in the art that the foregoing is illustrative only and not limiting, having been presented by way of example only. All the features disclosed in this specification (including any accompanying claims, abstract, and drawings) may be replaced by alternative features serving the same purpose, and equivalents or similar purpose, unless expressly stated otherwise. Therefore, numerous other embodiments of the modifications thereof are contemplated as falling within the scope of the present invention as defined by the appended claims and equivalents thereto.

What is claimed is:

1. A load storage apparatus comprising:
   a rack including at least one load support, the load support including a detection part;
   a transferrer including a carrier for transferring loads to and from the load support of the rack by means of transfer that includes movement relative to the load support of the rack, the carrier including a load supporting plate and a detector; the detector for detecting the detection part of the load support of the rack; and
   a learning system; wherein the learning system measures a distance for which the carrier moves from a reference position toward the load support until the detector detects an associated detection part; wherein the leaning system, based at least in part on the measured distance, computes a distance for which the carrier moves from the reference position to a position to load and unload the load support; wherein the learning system stores the computed distance as a learned distance for the load support; and
   wherein the carrier can move on the basis of the learned distance to operate for the load support; and
   wherein the detector is fitted detachably to the load supporting plate of the carrier so as to be detached except for a time of learning operation; and
   a positioner for positioning a load on the carrier, the positioner capable of positioning the detector on the carrier.

2. A load storage apparatus according to claim 1 wherein the at least one load support includes a plurality of load supports.

3. A load storage apparatus according to claim 1 wherein the detection part of the load support is an end thereof facing the carrier.

4. A load storage apparatus according to claim 3 wherein the at least one load support includes a plurality of load supports.

5. A load storage apparatus according to claim 1 wherein the load support is a vertically arranged stage of the load support, and wherein the carrier moves vertically to operate for the stage of the load support;
   the load supped including a second detection part;
   the transferrer including a second detector for detecting the second detection part of the load support;
   wherein the learning system can measure a vertical distance for which the carrier moves vertically from a vertical reference position until the second detector detects the second detection part of the load support; wherein the learning system, based at least in part on the measured vertical distance, computes a vertical distance for which the carrier moves vertically from the vertical reference position to a vertical position for load transfer to and from the load support; wherein the learning system stores the computed vertical distance as a learned vertical distance for the load support; and
   wherein the carrier can move vertically on the basis of the learned vertical distance to operate for the load support.

6. A load storage apparatus according to claim 5 wherein the at least one load support includes a plurality of load supports.

7. A load storage apparatus according to claim 5 wherein the second detection part of the load support is formed on an end face thereof facing the carrier.

8. A load storage apparatus according to claim 7 wherein the at least one load support includes a plurality of load supports.

9. A load storage apparatus according to claim 5 wherein the load support is arranged around the transferrer, and wherein the carrier can turn on a vertical axis toward and away from the load support;
   the load support including a third detection part;
   the transferrer including a third detector for detecting the third detection part of the load support;
   wherein the learning system can measure an angle for which the carrier turns from an angular reference position until the third detector detects the third detection part of each load support; wherein the learning system stores the measured angle as a learned angle for the load support; and
   wherein the carrier can turn on the basis of the learned angle to operate for the load support.

10. A load storage apparatus according to claim 9 wherein the at least one load support includes a plurality of load supports.

11. A load storage apparatus according to claim 9 wherein the third detection part of the load support is formed on an end face thereof facing the carrier.

12. A load storage apparatus according to claim 11 wherein the at least one load support includes a plurality of load supports.

13. A load storage apparatus comprising:
    a rack including at least one load support, the load support including a detection part;
    a transferrer including a carrier for transferring loads to and from the load support of the rack by means of transfer that includes movement relative to the load support of the rack, the carrier including a load supporting plate and a detector; the detector for detecting the detection part of the load support of the rack; and
    a learning system; wherein the learning system measures a distance for which the carrier moves from a reference position toward the load support until the detector detects an associated detection part; wherein the leaning system, based at least in part on the measured distance, computes a distance for which the carrier moves from the reference position to a position to load and unload the load support; wherein the learning system stores the computed distance as a learned distance for the load support; and
    wherein the carrier can move on the basis of the learned distance to operate for the load support; and
    wherein the detector is fined detachably to the load supporting plate of the carrier so as to be detached except for a time of learning operation; and
    a positioner for positioning a load on the carrier, the positioner capable of positioning the detector on the carrier wherein the load support is a vertically arranged stage of the load support, and wherein the carrier moves vertically to operate for the stage of the load support;
    the load support including a second detection part;
    the transferrer including a second detector for detecting the second detection part of the load support;
    wherein the learning system can measure a vertical distance for which the carrier moves vertically from a vertical reference position until the second detector detects the second detection part of the load support; wherein the learning system, based at least in part on the measured vertical distance, computes a vertical distance for which the carrier moves vertically from the vertical reference position to a vertical position for load transfer to and from the load support; wherein the learning system stores the computed vertical distance as a learned vertical distance for the load support; and wherein the carrier can move vertically on the basis of the learned vertical distance to operate for the load support; and wherein the load support is arranged around the transferrer, and wherein the carrier can turn on a vertical axis toward and away from the load support;

the load support including a third detection part;

the transferrer including a third detector for detecting the third detection part of the load support;

wherein the learning system can measure an angle for which the carrier turns from an angular reference position until the third detector detects the third detection part of each load support; wherein the learning system stores the measured angle as a learned angle for the load support; and wherein the carrier can turn on the basis of the learned angle to operate for the load support.

14. A load storage apparatus according to claim 13 wherein the at least one load support includes a plurality of load supports.

15. A load storage apparatus according to claim 13 wherein the third detection part of the load support is formed on an end face thereof facing the carrier.

16. A load storage apparatus according to claim 15 wherein the at least one load support includes a plurality of load supports.

* * * * *